(12) United States Patent
Uriu et al.

(10) Patent No.: US 8,185,864 B2
(45) Date of Patent: May 22, 2012

(54) CIRCUIT BOARD ANALYZER AND ANALYSIS METHOD

(75) Inventors: Kazuhide Uriu, Osaka (JP); Toru Yamada, Osaka (JP); Masahiro Yamaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 370 days.

(21) Appl. No.: 12/417,214

(22) Filed: Apr. 2, 2009

(65) Prior Publication Data

US 2009/0254873 A1    Oct. 8, 2009

(30) Foreign Application Priority Data

Apr. 3, 2008  (JP) ................................ 2008-096844

(51) Int. Cl.
*G06F 17/50* (2006.01)
(52) U.S. Cl. ........ 716/137; 716/107; 716/111; 716/114; 703/2; 703/14
(58) Field of Classification Search ............. 716/5, 111, 716/106, 107, 114, 137

See application file for complete search history.

(56) References Cited

U.S. PATENT DOCUMENTS

| 2003/0109995 | A1 | 6/2003 | Mabuchi et al. | |
| 2008/0270964 | A1* | 10/2008 | Kobayashi et al. | 716/8 |

FOREIGN PATENT DOCUMENTS

| EP | 0 845 746 | 6/1998 |
| EP | 2 040 186 | 3/2009 |
| JP | 10-214281 | 8/1998 |
| JP | 2003-157296 | 5/2003 |
| WO | 2008/087849 | 7/2008 |

* cited by examiner

*Primary Examiner* — Vuthe Siek
*Assistant Examiner* — Mohammed Alam
(74) *Attorney, Agent, or Firm* — Hamre, Schumann, Mueller & Larson, P.C.

(57) ABSTRACT

A circuit board analyzer includes a storage unit for storing mesh position information on an analyzed mesh-division model and extracted circuit constants in relation to each other; a division-model configuration unit for dividing the layout of a circuit board into meshes to configure a new mesh-division model; an identical-mesh determination unit for making a comparison between mesh position information on the new mesh-division model and mesh position information on the analyzed mesh-division model to determine identical meshes that have identical mesh position information; and a circuit-constant extraction unit for performing analytical processing based on the new mesh-division model to extract new circuit constants and reusing, as a new circuit constant associated with the identical meshes, an extracted circuit constant that is related to the mesh position information on the identical meshes.

16 Claims, 15 Drawing Sheets

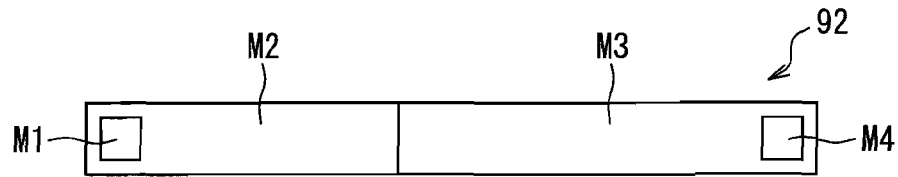
FIG. 2A
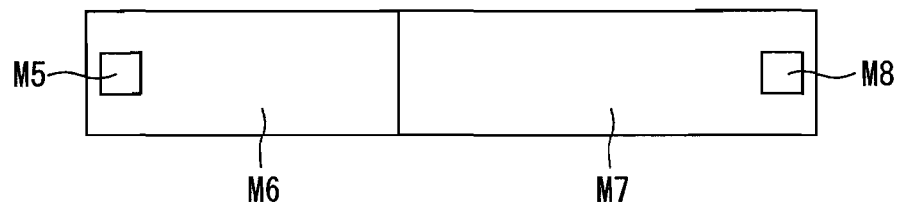
FIG. 2B
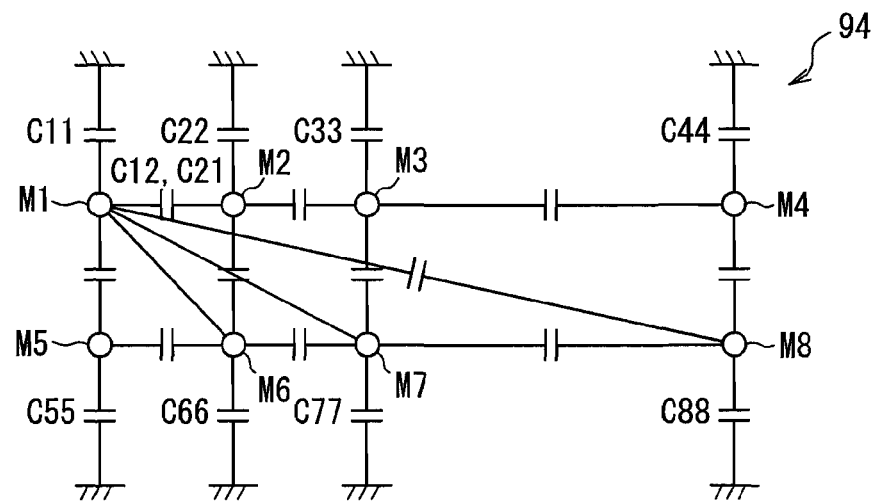
FIG. 2C
FIG. 2D

FIG. 7A $$\begin{bmatrix} C11 & C12 & C13 & C14 & C15 & C16 & C17 & C18 \\ C21 & C22 & C23 & C24 & C25 & C26 & C27 & C28 \\ C31 & C32 & C33 & C34 & C35 & C36 & C37 & C38 \\ C41 & C42 & C43 & C44 & C45 & C46 & C47 & C48 \\ C51 & C52 & C53 & C54 & C55 & C56 & C57 & C58 \\ C61 & C62 & C63 & C64 & C65 & C66 & C67 & C68 \\ C71 & C72 & C73 & C74 & C75 & C76 & C77 & C78 \\ C81 & C82 & C83 & C84 & C85 & C86 & C87 & C88 \end{bmatrix}$$

(16, 15)

FIG. 7B $$\begin{bmatrix} 0.5 & 0.25 & 0.25 & 0.15 & C15 & C16 & C17 & C18 \\ 0.25 & 5 & 0.15 & 0.02 & C25 & C26 & C27 & C28 \\ 0.25 & 0.15 & 3 & 0.15 & C35 & C36 & C37 & C38 \\ 0.15 & 0.02 & 0.15 & 0.3 & C45 & C46 & C47 & C48 \\ C51 & C52 & C53 & C54 & C55 & C56 & C57 & C58 \\ C61 & C62 & C63 & C64 & C65 & C66 & C67 & C68 \\ C71 & C72 & C73 & C74 & C75 & C76 & C77 & C78 \\ C81 & C82 & C83 & C84 & C85 & C86 & C87 & C88 \end{bmatrix}$$

(16, 95)

FIG. 7C $$\begin{bmatrix} 0.5 & 0.25 & 0.25 & 0.15 & 0.06 & 0.1 & 0.1 & 0.1 \\ 0.25 & 5 & 0.15 & 0.02 & 0.06 & 1 & 1 & 0.1 \\ 0.25 & 0.15 & 3 & 0.15 & 0.06 & 0.6 & 0.6 & 0.1 \\ 0.15 & 0.02 & 0.15 & 0.3 & 0.06 & 0.06 & 0.06 & 0.06 \\ 0.06 & 0.06 & 0.06 & 0.06 & 0.3 & 0.15 & 0.15 & 0.15 \\ 0.1 & 1 & 0.6 & 0.06 & 0.15 & 6 & 3 & 0.25 \\ 0.1 & 1 & 0.6 & 0.06 & 0.15 & 3 & 8 & 0.25 \\ 0.1 & 0.1 & 0.1 & 0.06 & 0.15 & 0.25 & 0.25 & 0.5 \end{bmatrix}$$

(18, 95)

$$\begin{bmatrix} 0.5 & 0.25 & 0.25 & 0.15 & 0.1 & 0.1 & 0.1 & 0.06 \\ 0.25 & 5 & 0.15 & 0.02 & 0.1 & 1 & 0.6 & 0.06 \\ 0.25 & 0.15 & 3 & 0.15 & 0.01 & 0.6 & 0.6 & 0.06 \\ 0.15 & 0.02 & 0.15 & 0.3 & 0.06 & 0.06 & 0.06 & 0.06 \\ 0.1 & 0.1 & 0.01 & 0.06 & 0.5 & 0.25 & 0.25 & 0.15 \\ 0.1 & 1 & 0.6 & 0.06 & 0.25 & 5 & 1.5 & 0.15 \\ 0.1 & 0.6 & 0.6 & 0.06 & 0.25 & 1.5 & 3 & 0.15 \\ 0.06 & 0.06 & 0.06 & 0.06 & 0.15 & 0.15 & 0.15 & 0.3 \end{bmatrix}$$

FIG. 8A $$\begin{bmatrix} 0.5 & 0.25 & 0.25 & 0.15 \\ 0.25 & 5 & 0.15 & 0.02 \\ 0.25 & 0.15 & 3 & 0.15 \\ 0.15 & 0.02 & 0.15 & 0.3 \end{bmatrix}$$

FIG. 8B $$\begin{bmatrix} 0.5 & 0.25 & 0.25 & 0.15 & C15 & C16 & C17 & C18 \\ 0.25 & 5 & 0.15 & 0.02 & C25 & C26 & C27 & C28 \\ 0.25 & 0.15 & 3 & 0.15 & C35 & C36 & C37 & C38 \\ 0.15 & 0.02 & 0.15 & 0.3 & C45 & C46 & C47 & C48 \\ C51 & C52 & C53 & C54 & C55 & C56 & C57 & C58 \\ C61 & C62 & C63 & C64 & C65 & C66 & C67 & C68 \\ C71 & C72 & C73 & C74 & C75 & C76 & C77 & C78 \\ C81 & C82 & C83 & C84 & C85 & C86 & C87 & C88 \end{bmatrix}$$

FIG. 8C $$\begin{bmatrix} 0.5 & 0.25 & 0.25 & 0.15 & 0.06 & 0.1 & 0.1 & 0.1 \\ 0.25 & 5 & 0.15 & 0.02 & 0.06 & 1 & 1 & 0.1 \\ 0.25 & 0.15 & 3 & 0.15 & 0.06 & 0.6 & 0.6 & 0.1 \\ 0.15 & 0.02 & 0.15 & 0.3 & 0.06 & 0.06 & 0.06 & 0.06 \\ 0.06 & 0.06 & 0.06 & 0.06 & 0.3 & 0.15 & 0.15 & 0.15 \\ 0.1 & 1 & 0.6 & 0.06 & 0.15 & 6 & 3 & 0.25 \\ 0.1 & 1 & 0.6 & 0.06 & 0.15 & 3 & 8 & 0.25 \\ 0.1 & 0.1 & 0.1 & 0.06 & 0.15 & 0.25 & 0.25 & 0.5 \end{bmatrix}$$

FIG. 8D

CIRCUIT BOARD ANALYZER AND ANALYSIS METHOD

BACKGROUND OF THE INVENTION

1. Field of the Invention

The present invention relates to a circuit board analyzer and analysis method, and in particular relates to a method for electromagnetic field analysis of a circuit board used in various kinds of electronic equipment.

2. Description of Related Art

Printed circuit board (wiring board) design often has been done with the help of computer-based printed circuit board CAD (Computer Aided Design) (cf., JP H10-214281A). Despite the high degree of automation in CAD device-based printed circuit board design, it is also the fact that there still are quite a few things that cannot be designed properly if the designer is unskilled.

The design of a printed circuit board for a high frequency circuit has to be made with consideration given to the influence of parasitic effects (couplings) that depend on a wiring layout pattern on a circuit board, because inter-wiring interference may have a significant influence over the transmission characteristics. The amount of such inter-wiring interference can be analyzed by complicated computations based on an electromagnetic field analysis.

For example, in obtaining the amount of inter-wiring interference through an electromagnetic field analysis, such wiring that has a wiring pattern 1000 as illustrated in FIG. 16A cannot be subjected as-is to such an electromagnetic field analysis. The entire wiring pattern 1000 is thus, as illustrated in FIG. 16B, divided into meshes (which forms a wiring pattern 2000), an electromagnetic field analysis is performed on an analytical model composed of the cells obtained by the division, and the interaction among the individual cells is calculated; which completes the entire electromagnetic field analysis. The amount of inter-wiring interference can be obtained from the results of this entire electromagnetic field analysis.

SUMMARY OF THE INVENTION

However, it is required in the actual design of complex wiring to obtain wiring characteristics from highly complicated computations based on electromagnetic field analysis. Thus, the fact is that unlike in the case of analyzing a simple, textbook-style wiring model, an enormous amount of analytical processing time is required in order to obtain the amount of inter-wiring interference with high precision; on the other hand, if a rough electromagnetic field analysis is performed in order to speed up the analysis, problems with the accuracy of such analyses often occur. For instance, as illustrated in FIG. 16A, in the case of analyzing the wiring pattern 1000, which has a complicated configuration (in the present example, the wiring pattern of a single internal layer of a multilayer substrate), the number of meshes obtained by division is enormous as illustrated in FIG. 16B; therefore, although the amount of inter-wiring interference can be obtained through electromagnetic field analysis, an enormous amount of computation time is necessary.

For instance, according to studies of the inventors of the present invention, when a wiring board to be analyzed is a multilayer, namely, an eight-layer substrate that has dimensions of 40 mm×40 mm and whose number of nets (the number of wires providing connection between parts) is 550 and whose number of vias that provide electrical connection between layers is 5000, the following results are predicted. In an electromagnetic field analysis using a 3 GHz Pentium®-4 processor for a CPU and two gigabytes of memory by the method of moments, it was inferred that the analysis cannot be performed at 20 frequency points because the amount of physical memory required for a structure to be analyzed exceeded the amount of computer memory. Even if the problem of a limited amount of memory was solved, it was predicted that a minimum of 500 hours would be required for the implementation of such an analysis.

Moreover, it is natural to consider that the processing time and the amount of processing data increase with an increasing number of frequency points. In addition, electromagnetic field analysis is performed not only once but every time any improvement is made to a wiring board; therefore, in actuality, except for the case of wiring boards with extremely simple configurations, obtaining the amount of inter-wiring interference through electromagnetic field analysis is extremely time-consuming work. On the other hand, if the number of frequency points is reduced or the size of the meshes obtained by division is increased, it is possible to shorten the analysis time and thereby forcefully to perform electromagnetic field analysis; however, this may decrease the accuracy of the amount of inter-wiring interference, thus resulting in a failure to achieve the required accuracy satisfactorily.

In this way, for a high-precision electromagnetic field analysis that produces a usable level of results, the analysis time is not at all enough; on the other hand, if a rough electromagnetic field analysis is performed in order to speed up the analysis, the accuracy of such an analysis is sacrificed and the required accuracy cannot be achieved, and so on. In other words, it had been difficult to strike a balance between the speed and the accuracy of such analyses. Thus, the fact is that consideration of the amount of inter-wiring interference often has been entrusted to what is called the skilled designer's intuition, instead of being based on electromagnetic field analysis, or that printed circuit board design often has been performed by trial and error without giving any consideration to the amount of inter-wiring interference.

The present invention has been devised with the foregoing in mind, and its object is to provide a method for electromagnetic field analysis of a circuit board, which allows a considerable reduction in analytical processing time without sacrificing the accuracy of such analysis.

An analyzer according to the present invention is a circuit board analyzer for dividing the layout of a circuit board into meshes and implementing analytical processing based on a mesh-division model obtained by such division to extract a circuit constant associated with each mesh of the mesh-division model.

This analyzer includes: a storage unit for storing mesh position information on an analyzed mesh-division model that has gone through the analytical processing and extracted circuit constants obtained through the analytical processing in relation to each other; a division-model configuration unit for dividing the layout of a new to-be-analyzed circuit board into meshes to configure a new mesh-division model; an identical-mesh determination unit for making a comparison between mesh position information on the new mesh-division model and mesh position information on the analyzed mesh-division model to determine identical meshes that have identical mesh position information; and a circuit-constant extraction unit for performing analytical processing based on the new mesh-division model to extract a new circuit constant associated with each mesh of the new mesh-division model and simultaneously reusing, as a new circuit constant associated with the determined identical meshes, an extracted circuit constant that is related to the mesh position information on the identical meshes.

Further, this analyzer may include a division-model configuration unit for dividing a layout of a to-be-analyzed circuit board into new meshes, configuring position information of each of the new meshes, and generating data showing an equivalent circuit corresponding to the new meshes; and a circuit-constant extraction unit for gaining access to a storage unit that stores analyzed mesh position information and a circuit constant of an equivalent circuit corresponding to the analyzed meshes, and calculating circuit constants of the new meshes and storing the circuit constants in the storage unit by use of any circuit constants of analyzed meshes having position information identical to the position information of the new meshes.

Similarly in this configuration, when the storage unit has a circuit constant of a mesh having position information identical to that of an analyzed mesh, the circuit constant can be used for calculating a circuit constant of a new mesh. Therefore, it is possible to shorten the analytical processing time without sacrificing the accuracy of the analysis.

For example, according to one embodiment of the invention, the mesh position information includes vertex coordinates for each mesh.

For example, according to another embodiment of the invention, the division-model configuration unit configures an analytical circuit model based on the relative positions of the meshes obtained by the division.

For example, according to still another embodiment of the invention, the division-model configuration unit configures the analytical circuit model with a cell for each mesh and a branch between each pair of adjacent meshes.

For example, according to still another embodiment of the invention, the circuit-constant extraction unit constructs a reuse setting by substituting the extracted circuit constants for some matrix elements.

For example, according to still another embodiment of the invention, the circuit-constant extraction unit constructs a reuse setting by deleting the extracted circuit constants from some matrix elements and adding new elements.

For example, according to still another embodiment of the invention, the division-model configuration unit generates data of an equivalent circuit representing the impedance on the new mesh with a component comprising at least one element selected from the group consisting of resistance (R), inductance (L), conductance (G) and capacitance (C). The circuit-constant extraction unit calculates at least one value of the resistance (R), the inductance (L), the conductance (G) and the capacitance (C) as the circuit constant.

Thereby, the impedance of each mesh is isolated into a circuit constant of at least one of resistance (R), inductance (L), conductance (G) and capacitance (C) and then calculated. This facilitates storage and reuse of the circuit constant.

For example, according to still another embodiment of the invention, the division-model configuration unit divides the layout of the circuit board into new meshes and sets cells each corresponding to each of the new meshes; and generates data of an equivalent circuit comprising capacitance (C) between each of the cells and the ground, and capacitance (C) between each pair of cells.

Thereby, the components of the parasitic capacitance on each of the new meshes and between each pair of the meshes can be isolated to be calculated and stored. This facilitates storage and reuse of the circuit constant.

For example, according to still another embodiment of the invention, the division-model configuration unit divides the layout of the circuit board into new meshes and sets a branch between each pair of new meshes, and generates data of an equivalent circuit comprising self-inductance (L) at each of the branches and mutual inductance (L) between each pair of branches.

Thereby, the components between each pair of meshes can be isolated to be calculated and stored. This facilitates storage and reuse of the circuit constant.

For example, according to still another embodiment of the invention, the division-model configuration unit divides the layout of the circuit board into new meshes and sets cells each corresponding to each of the new meshes and branches connecting the cells, and generates data of an equivalent circuit comprising: resistance (R) and inductance (L) corresponding to each of the branches, mutual inductance (L) between each pair of branches, capacitance (C) and conductance (G) between each of the cells and the ground, and capacitance (C) and conductance (G) between each pair of cells.

Thereby, the components of the parasitic capacitance and conductance of each of the new meshes and pair of meshes, the components of the resistance between pair of new meshes, the self-inductance and the mutual inductance can be isolated to be calculated and stored. This facilitates storage and reuse of the circuit constant. Furthermore, based on these circuit constants, various analyses such as a S-matrix operation can be implemented.

An analysis method according to the present invention is a circuit board analysis method in which the layout of a circuit board is divided into meshes and analytical processing is performed based on a mesh-division model obtained by such division to extract a circuit constant associated with each mesh of the mesh-division model.

The method includes: a storage step of storing mesh position information on an analyzed mesh-division model that has gone through the analytical processing and extracted circuit constants obtained through the analytical processing in relation to each other; a division-model configuration step of dividing the layout of a new to-be-analyzed circuit board into meshes to configure a new mesh-division model; an identical-mesh determination step of making a comparison between the mesh position information on the new mesh-division model and the mesh position information on the analyzed mesh-division model to determine identical meshes that have identical mesh position information; and a circuit-constant extraction step of performing analytical processing based on the new mesh-division model to extract a new circuit constant associated with each mesh of the new mesh-division model and reusing, as a new circuit constant associated with the determined identical meshes, an extracted circuit constant that is related to the mesh position information on the identical meshes.

For example, according to one embodiment of the invention, the mesh position information includes vertex coordinates for each mesh.

For example, according to another embodiment of the invention, the division-model configuration unit configures an analytical circuit model based on the relative positions of the meshes obtained by the division.

For example, according to still another embodiment of the invention, the division-model configuration unit configures the analytical circuit model with a cell for each mesh and a branch between each pair of adjacent meshes.

For example, according to still another embodiment of the invention, the circuit-constant extraction unit constructs a reuse setting by substituting the extracted circuit constants for some matrix elements.

For example, according to still another embodiment of the invention, the circuit-constant extraction unit constructs a reuse setting by deleting the extracted circuit constants from some matrix elements and adding new elements.

Similarly, a program that functions a computer as the above-described analyzer for a circuit substrate, or a recording medium that records such a program, is also an embodiment of the present invention.

In the analysis method according to the present invention, mesh position information on the analyzed mesh-division model that has gone through the analytical processing and extracted circuit constants obtained through the analytical processing are stored in relation to each other, and the stored extracted circuit constants are reused in the next and subsequent analyses. Thus, part of the analytical processing can be omitted, which simplifies such analytical processing. This considerably shortens the analytical processing time without sacrificing the accuracy of the analysis at all. Moreover, such a considerable reduction in processing time facilitates the provision of feedback on circuit board design, thus allowing the optimization of circuit board layouts.

BRIEF DESCRIPTION OF THE DRAWINGS

FIG. 2A is a plan view of a layout divided into meshes. FIG. 2B illustrates an example of an analytical circuit model. FIGS. 2C and 2D illustrate an example of a C-matrix.

FIGS. 7A to 7C are explanatory diagrams illustrating an example of how to construct a reuse setting.

FIGS. 8A to 8D are explanatory diagrams illustrating another example of how to construct a reuse setting.

DETAILED DESCRIPTION OF THE INVENTION

Figure 1:
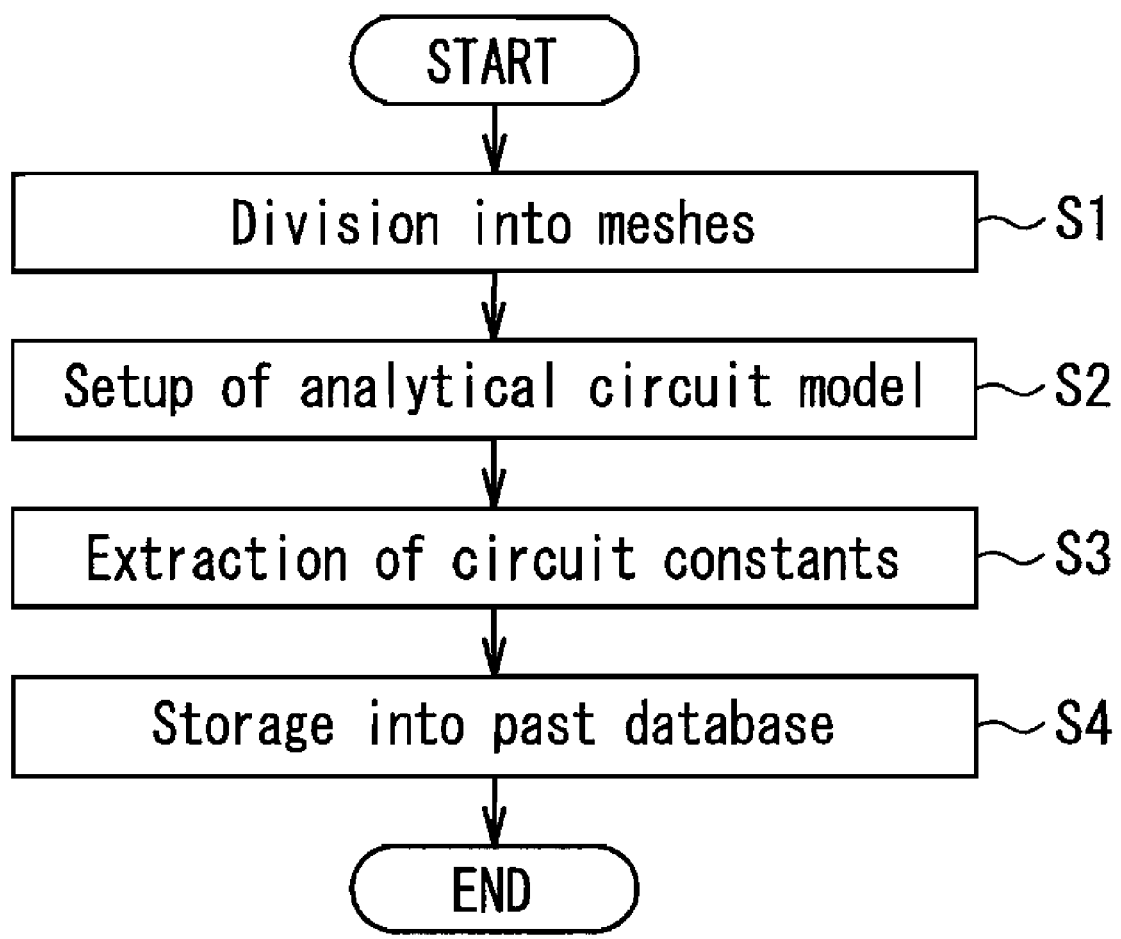
FIG. 1 is a flow chart illustrating an example of a fundamental circuit board analysis method according to one embodiment of the present invention.

Hereinafter, the present invention will be described by way of illustrative embodiments with reference to the drawings. In the following drawings, those components that are substantially identical in function are denoted by the same reference numerals or characters to simplify the description. The present invention is, however, not limited to the embodiments described below.

Figure 16A:
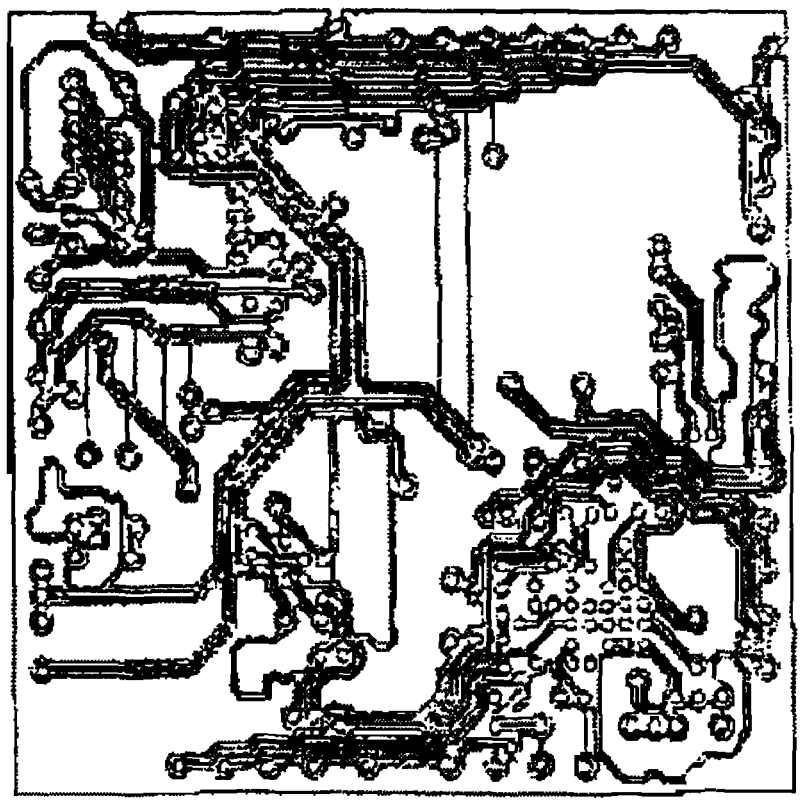
FIG. 16A is a plan view of a wiring pattern 1000 of an internal layer of a multilayer substrate.
Figure 16B:
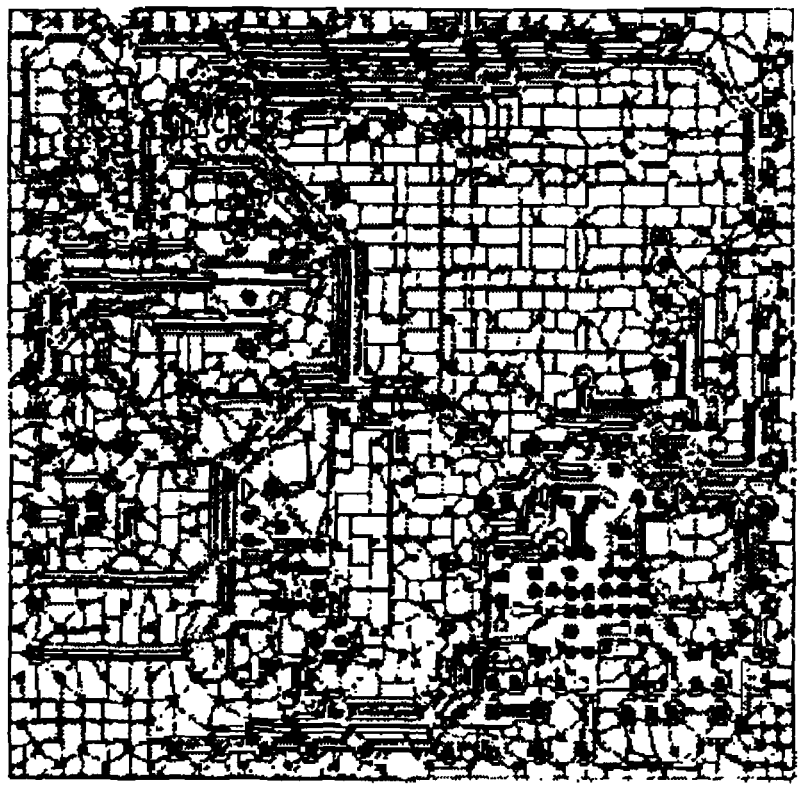
FIG. 16B is a plan view of a wiring pattern 2000 obtained by dividing the wiring pattern 1000 into meshes.

In a technique based on typical electromagnetic field analysis, an enormous amount of processing time is necessary because wiring is divided into meshes as illustrated in FIG. 16B, and every individual segment (mesh) obtained by the division is subjected to electromagnetic field analysis (analytical computations).

With this in mind, the inventors of the present invention have accomplished the present invention, based on their findings that the analytical processing time can be shortened considerably without sacrificing the accuracy of such an analysis at all, if the results (or circuit constants) obtained through analytical processing are stored in history databases in relation to position information on each mesh and those analytical results (or circuit constants) stored in the databases are reused as is in the next and subsequent analyses. This is described hereinafter.

Referring to FIG. 1 and FIGS. 2A to 2D, a fundamental analysis method according to the present embodiment is briefly described. According to this analysis method, first in step S1, a circuit board layout 90 is divided into meshes (grid elements) to configure a mesh-division model 92. In FIG. 2A, the circuit board layout 90 is divided into eight rectangular meshes M1 to M8 to configure the mesh-division model 92.

Then, in step S2, an analytical circuit model 94 is configured based on the relative positions of the meshes M1 to M8 obtained by the division. This analytical circuit model 94 is a network that is generated considering the influence of parasitic elements as a result of the meshes M1 to M8 obtained by the division; and that is composed of, for example, elements (components) including resistance (R), capacitance (C), inductance (L), and conductance (G).

In FIG. 2B, the analytical circuit model 94 is so configured that each of the meshes M1 to M8 has a self-capacitance element relative to the ground (GND) and a mutual capacitance element is provided between each pair of adjacent meshes. For instance, the mesh M1 has a self-capacitance element C11, and mutual capacitance elements C12 and C21 are provided between the two meshes M1 and M2. To simplify the drawing, some of the mutual capacitances are not shown.

Then, in step S3, analytical processing is performed based on the analytical circuit model 94 to extract a circuit constant associated with each of the meshes M1 to M8. The term "circuit constant" as used herein refers to the value of each element (component) of the analytical circuit model 94. The extraction of the circuit constants is performed by converting the elements of the analytical circuit model 94 into a matrix form and deriving each element (or the value of each element) of the converted matrix.

In the present embodiment, as illustrated in FIG. 2C, the analytical circuit model 94 is converted into a C-matrix 96, and then each element (the value of each capacitance element) of this converted C-matrix 96 is derived from an analysis operation. FIG. 2D illustrates a circuit-constant matrix 98 derived from such an analysis operation. Through this analysis operation, for example, the value of the self-capacitance element C11 is extracted as a circuit constant associated with the mesh M1. Likewise, the values of the mutual capacitance elements C12 and C21 are extracted as the circuit constants associated with the space between the two meshes M1 and M2. It is noted herein that a C-matrix used in actual analytical processing is isolated from impedance Z in the form of reciprocals (1/C'), so that the matrix in FIG. 2C is a matrix that is obtained by further inversely transforming the isolated reciprocals (1/C').

The technique of such analytical processing is not limited in particular, and various techniques, such as the method of moments, the PEEC (partial element equivalent circuit) method, etc., can be adopted. Or, a quasi-static approximation of Green's function may be used. In this way, the influence of parasitic elements (in the present example, capacitance elements) as a result of a circuit board layout can be analyzed.

In the analysis method according to the present embodiment, such extracted circuit constants are stored in a history database to be reused in the next and subsequent analyses. Specifically, in step S4, the circuit constants (the values of elements) obtained through analytical processing are stored in a history database as extracted circuit constants. At the same time, mesh position information on the mesh-division model 92 that has gone through analytical processing is stored in the history database as mesh position information on an analyzed mesh-division model.

At that time, the mesh position information on the analyzed mesh-division model and the extracted circuit constants are stored in relation to each other in the history database. For example, the value (or circuit constant) of the self-capacitance element C11 associated with the mesh M1 is stored in relation to the mesh position information on the mesh M1. Likewise, the values (or circuit constants) of the mutual capacitance elements C12 and C21 associated with the space between the two meshes M1 and M2 are stored in relation to the mesh position information on the two meshes M1 and M2. In this way, the history database stores the mesh position information on the analyzed mesh-division model and the extracted circuit constants associated with the meshes in relation to each other.

It is noted herein that the mesh position information is information that represents the position of each mesh in an analytical region, and it may be any data that allows identification of where each mesh is located, using, for example, a combination of numeric values, etc. In the present embodiment, the mesh position information is equivalent to mesh coordinates that correspond to the four vertices of a rectangular mesh. The mesh coordinates may be absolute coordinates represented by the distances from an origin or may be relative coordinates represented by the distances from any arbitrary point. The mesh coordinates are not limited to the vertex coordinates of a mesh and may be any arbitrary coordinates in accordance with the shape of meshes. Moreover, the mesh position information may include not only mesh coordinates that represent the position of a mesh, but also any other information as to that position (e.g., data indicating mesh conditions, such as an analytical frequency, or a material constant.)

Figure 3:
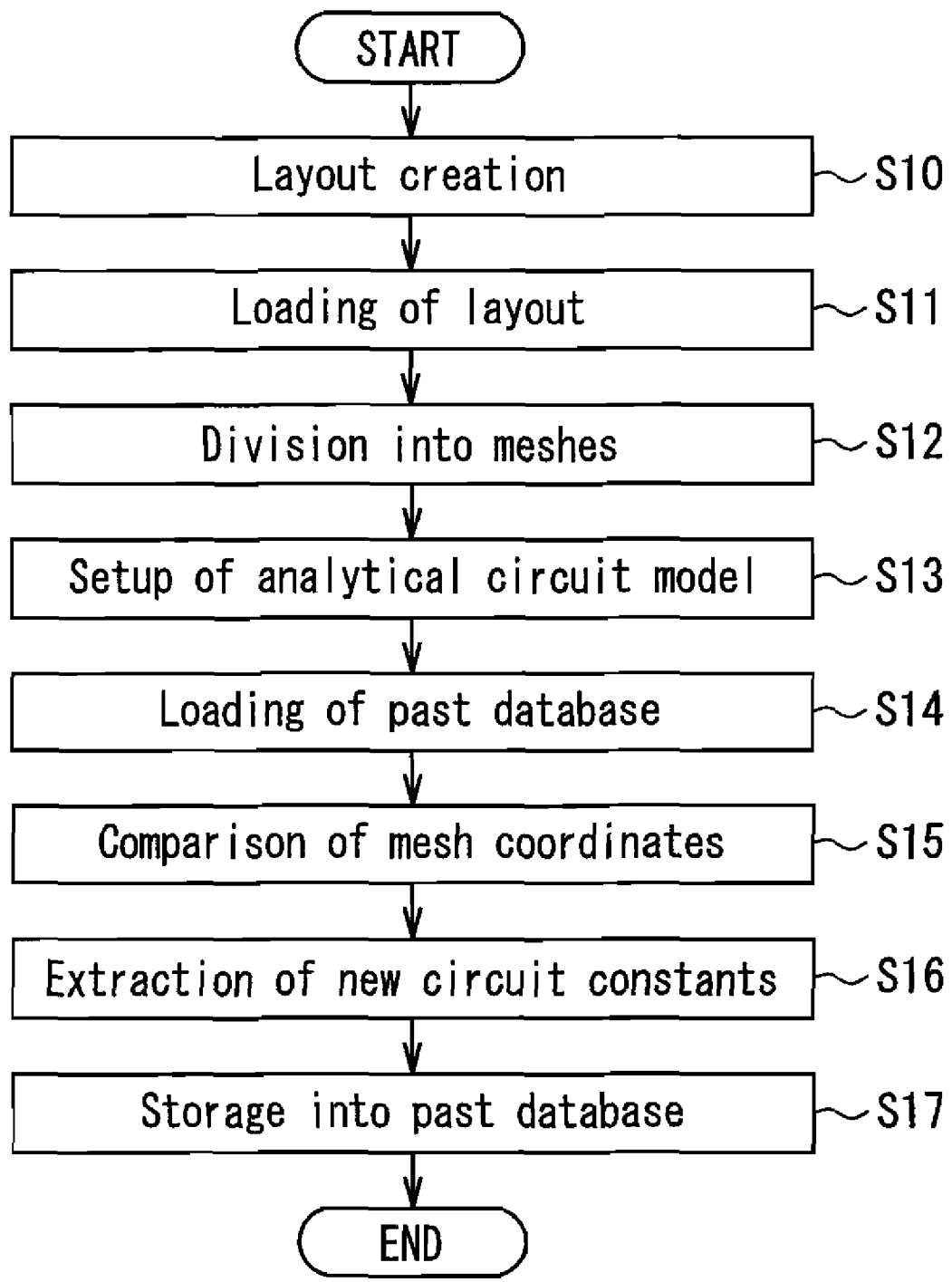
FIG. 3 is a flow chart illustrating an example of a circuit board analysis method according to one embodiment of the present invention.

Referring next to FIG. 3, the case where a circuit board layout is analyzed, using the analytical results stored in a history database, is described. FIG. 3 is a flow chart illustrating a process flow of the analysis method according to the present embodiment.

Figure 4A:
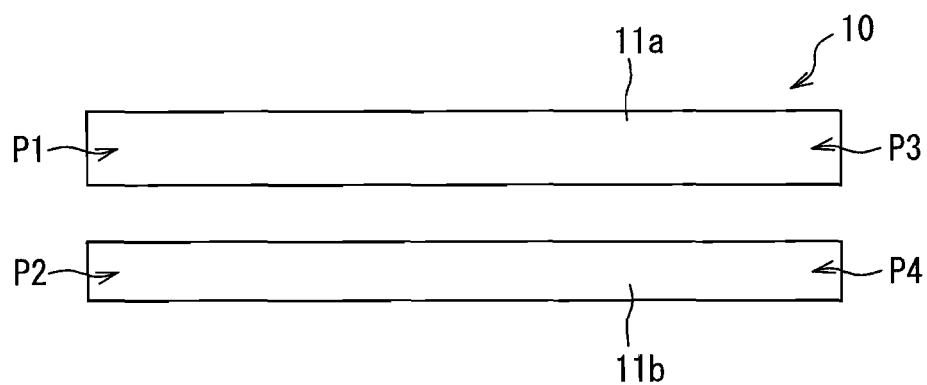
FIG. 4A illustrates an example of a new wiring layout to be analyzed.
Figure 4B:
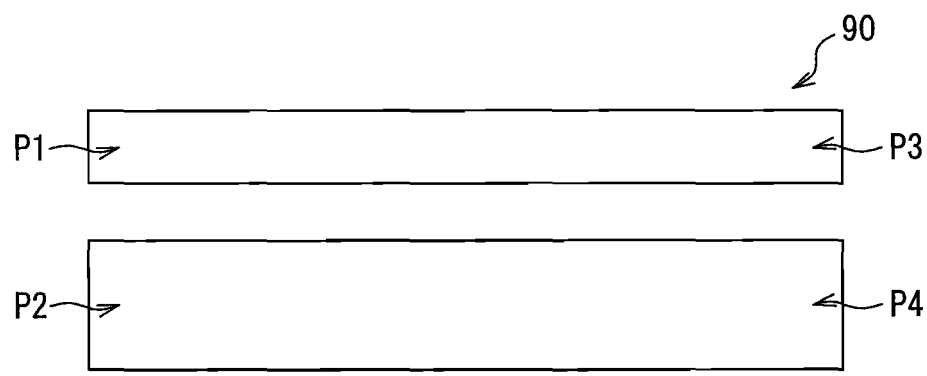
FIG. 4B illustrates an example of a layout stored in a history database.

In the analysis method according to the present embodiment, the layout of a new circuit board to be analyzed is first created (in step S10), and then the created circuit board layout is loaded (in step S11). FIG. 4A illustrates an example of such a new layout to be analyzed having been loaded. In the present example, two wires (11a and 11b) are placed in parallel. Each of the wires (11a and 11b) has ports (P1, P2, P3, and P4) at all ends thereof. These ports (P1, P2, P3, and P4) have the function of inputting and outputting an external signal into and from the wires (11a and 11b).

Then, in step S12, the circuit board layout 10 is divided into meshes to configure a new mesh-division model 12. The meshes may be of any shape that can divide a circuit board layout into a plurality of segments; they may be of, for example, rectangular, circular, or polygonal shape. The mesh is not limited to representing a two-dimensional region; it can represent a three-dimensional region.

In the present embodiment, as illustrated in FIG. 6A, the circuit board layout 10 is divided into rectangular meshes. In FIG. 6A, the wire 11a is divided into two meshes A2 and A3. Likewise, the wire 11b is divided into two meshes A6 and A7. Further in the present example, each port is regarded as an ultra-small mesh. Specifically, the ports P1 and P3 of the wire 11a correspond to meshes A1 and A4, and the ports P2 and P4 of the wire 11b to meshes A5 and A8. In this way, a new mesh-division model 12 is configured. The mesh size of each port may, where appropriate, vary depending on the analytical frequency. For example when the upper limit of the analytical frequency is 6 GHz, square meshes having dimensions of 0.5 mm×0.5 mm can be created.

Figure 6:
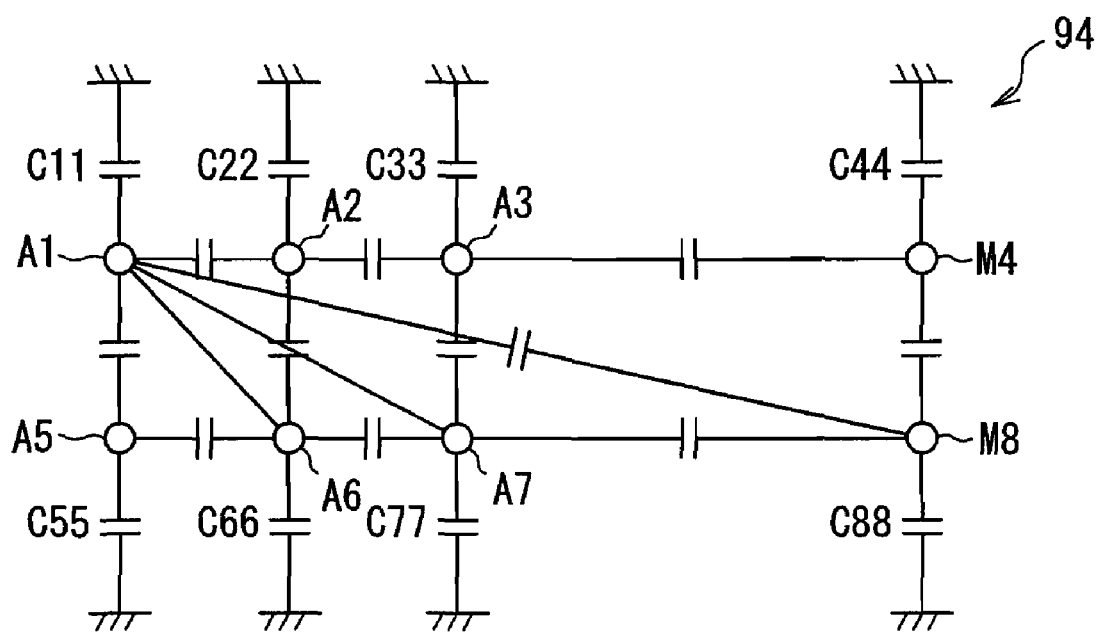
FIG. 6 is a diagram representing the new mesh-division model in FIG. 5A as an analytical circuit model.

Then, in step S13, an analytical circuit model 14 is configured based on the relative positions of the meshes A1 to A8 obtained by the division. In the present embodiment, as illustrated in FIG. 6, the analytical circuit model 14 is so configured that each of the meshes A1 to A8 has a self-capacitance element relative to the ground (GND), and mutual capacitance elements are provided between each pair of adjacent meshes. For instance, the mesh A1 has a self-capacitance element C11, and mutual capacitance elements C12 and C21 are provided between the two meshes A1 and A2. In this way, the capacitance elements associated with each of the meshes A1 to A8 are set. To simplify the drawing, some of the mutual capacitance elements are not shown.

Figure 5A:
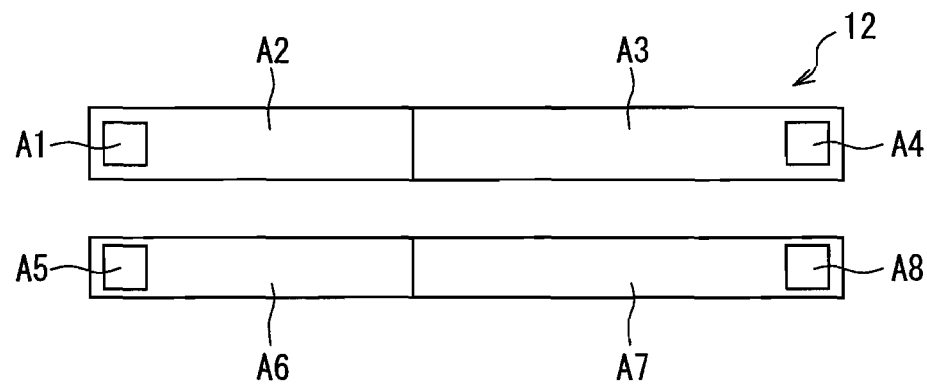
FIG. 5A illustrates an example of a new mesh-division model.
Figure 5B:
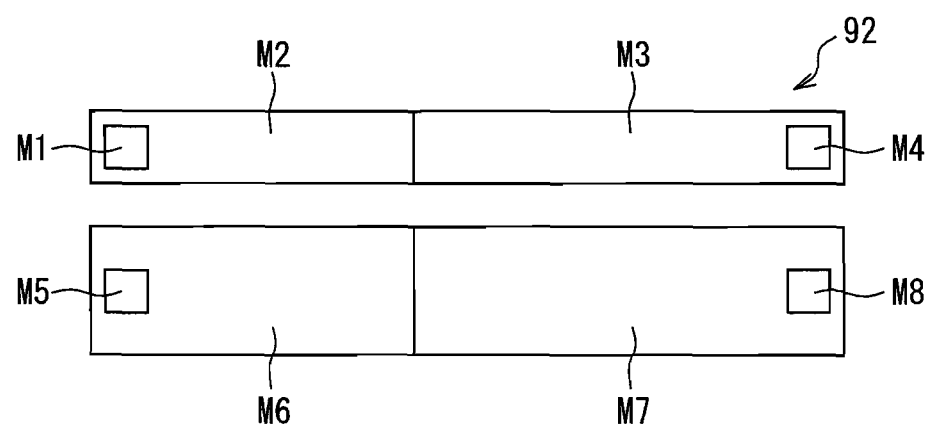
FIG. 5B illustrates an example of an analyzed mesh-division model stored in a history database.

Then, in step S14, a history database is accessed to acquire mesh position information on an analyzed mesh-division model stored in the history database. FIG. 5B illustrates the acquired analyzed mesh-division model 92. The acquired analyzed mesh-division model 92 is the same model as the one illustrated in FIG. 2A.

Then, in step S15, a comparison is made between the mesh position information on the new mesh-division model 12 and that on the analyzed mesh-division model 92 to determine identical meshes that have identical mesh position information. In the present embodiment, a comparison is made between the mesh position information on each of the meshes A1 to A8 in FIG. 5A and that on each of the meshes M1 to M8 in FIG. 5B to determine identical meshes that have identical mesh position information. In the present example, the meshes A1 to A4 in FIG. 5A are identical to the meshes M1 to M4 in FIG. 5B, so that the meshes A1 to A4 are determined as identical meshes.

When the mesh position information is on the vertex coordinates of a polygon that configures the mesh, for example, processing of comparing the vertex coordinates of the mesh on the new mesh-division model 12 and that on the analyzed mesh-division model 92 is implemented. When the comparison result shows that the distance between the vertex coordinates of the new mesh and the vertex coordinates of the analyzed mesh are within a predetermined range, they can be determined as identical to each other. The subjects for comparison can include a barycenter of the mesh, a representative point and the like as well as the vertex coordinates. Further, it is possible to compare any other information on the mesh position (for example, mesh conditions such as an analytic frequency and mesh properties such as a material constant).

Alternatively, it is possible to extract analyzed meshes identical to the new meshes by using a graphic comparison such as template matching. When data indicating modification history of the layout of the circuit board is available, the mesh at the modified portion can be determined. Therefore, as for the portion other than the modified portion, it is possible to determine that the meshes before the modification operation and the meshes after the modification operation are identical to each other.

Then, in step S16, analytical processing is performed based on the analytical circuit model 14 to extract a new circuit constant associated with each of the meshes A1 to A8. In the present embodiment, as illustrated in FIG. 7A, the capacitance elements of the analytical circuit model 14 are converted into a C-matrix 16, and then each element (the value of each capacitance element) of the converted C-matrix 16 is derived from an analysis operation. FIG. 7C illustrates a new circuit-constant matrix 18 derived from the analysis operation. Through the analysis operation, the value of a self-capacitance element C88 is extracted, for example, as the new circuit constant associated with the mesh A8. Likewise, the values of mutual capacitance elements C78 and C87 are extracted as the new circuit constants associated with the space between the two meshes A7 and A8.

At this time, the extracted circuit constants that are related to the mesh position information on the identical meshes A1 to A4 (i.e., the position information on the meshes M1 to M4) are used as the new circuit constants associated with the above-determined identical meshes A1 to A4. In other words, as the new circuit constants associated with the identical meshes A1 to A4, the extracted circuit constants stored in the history database are reused as is, instead of deriving the values of these elements through a new analysis operation.

For instance, an extracted circuit constant that is related to the position information on the identical mesh A1 (i.e., the position information on the mesh M1) is applied as is to the new circuit constant (the value of the self-capacitance element C11) associated with the identical mesh A1. Likewise, the extracted circuit constants that are related to the mesh position information on the identical meshes A1 and A2 (i.e., the mesh position information on the meshes M1 and M2) are applied as is to the new circuit constants (the values of the mutual capacitance elements C12 and C21) associated with the space between the two identical meshes A1 and A2.

A reuse setting is constructed by reconstructing a matrix generated from a mesh-division model. In the present embodiment, the reuse setting is constructed based on a matrix 16 in FIG. 7A generated from the new mesh-division model 12, i.e., by substituting the extracted circuit constants for values in the matrix 16.

In the present example, the matrix elements enclosed by the broken line 15 in FIG. 7A correspond to the new circuit constants associated with the identical meshes A1 to A4. Also, the matrix elements enclosed by the broken line 95 in FIG. 2D correspond to the extracted circuit constants related to the position information on the identical meshes A1 to A4 (i.e., the position information on the meshes M1 to M4).

Then, as illustrated in FIG. 7B, a reuse setting is constructed by substituting the extracted circuit constants enclosed by the broken line 95 in FIG. 2D for the matrix elements enclosed by the broken line 15 in FIG. 7A. Thereafter, as illustrated in FIG. 7C, the remaining matrix elements that were not substituted by the extracted circuit constants are subjected to an analysis operation to extract the remaining new circuit constants (values of capacitance elements).

Such new extracted circuit constants are stored as extracted circuit constants in a history database in relation to the position information on the meshes A1 to A8 and reused in the next and subsequent analyses (in step S17). Moreover, when the electrical characteristics of a circuit board that is evaluated using the new circuit constants are undesirable, the process returns to step S10 and repeats the processing in steps S10 to S17; on the other hand, when the electrical characteristics of the circuit board are desirable, the analytical processing of the layout is completed. In this way, the circuit board layout can be analyzed.

In the analysis method according to the present embodiment, mesh position information on an analyzed mesh-division model that has gone through analytical processing and extracted circuit constants obtained through the analytical processing are stored in a history database in relation to each other, and the analytical results (or extracted circuit constants) stored in the history database are reused as is in the next and subsequent analyses. Thus, part (in the above example, one-fourth) of the analysis operation can be omitted, which simplifies the analytical processing.

This considerably shortens the analytical processing time without sacrificing the accuracy of the analysis at all, and consequently facilitates the provision of feedback on circuit board design, thus allowing the optimization of circuit board layouts.

In a comparison between the mesh position information in FIG. 5A and that in FIG. 5B, there are four identical meshes out of eight meshes. In other words, as much as 50% of the layout is changed, so that only about 25% of the arithmetic section can be omitted. However, during actual layout design, electromagnetic field analysis is often repeatedly performed while changing only a small part of the layout little by little. Therefore, although depending on the size of the layout to be analyzed, the rate of layout change is in many cases on the order of only a few percent of the whole layout. In that case, most of the analysis operation can be omitted by constructing the aforementioned reuse setting. Thus, this reuse technique brings about significant advantages.

Still more in the present embodiment, the reuse setting is constructed based on the matrix 16 in FIG. 7A generated from the new mesh-division model 12, i.e., by substituting the extracted circuit constants for values in the matrix 16; however, the present invention is not limited thereto. For instance, based on the matrix (or the circuit constant matrix 98) generated from the analyzed mesh-division model 92, new elements may be added to the circuit constant matrix 98.

FIGS. 8A to 8D illustrate such an example. FIG. 8A illustrates the circuit constant matrix 98 in FIG. 2D. In the present example, the matrix elements enclosed by the broken line 95 in FIG. 8A correspond to the extracted circuit constants related to the position information on the identical meshes A1 to A4 (i.e., the position information on the meshes M1 to M4). A reuse setting is made first by, as illustrated in FIG. 8B, deleting all matrix elements other than those enclosed by the broken line 95 from the circuit constant matrix 98 and then by, as illustrated in FIG. 8C, adding to such an element-deleted matrix 98 the new capacitance elements associated with the meshes A5 to A8 that are irrelevant to the identical meshes. Thereafter, as illustrated in FIG. 8D, the newly added matrix elements are subjected to an analysis operation to extract the remaining new circuit constants (the values of capacitance elements) that were not reused extracted circuit constants.

Although the above example illustrates the case where the analytical circuit model is configured with capacitance elements and the values of the capacitance elements are extracted as circuit constants, extractable circuit constants are not limited to the values of the capacitance elements and may be the values of any other element.

For example, in the analytical circuit model as shown in FIG. 6, conductance can be provided in place of or in addition to the capacitance element. Namely, it is possible to provide data of an equivalent circuit as an analytical circuit model where the conductance between each of the meshes and a ground and also between each pair of meshes exist.

Furthermore, in another embodiment, an analytical circuit model is a network that is generated considering the influence of parasitic elements as a result of the meshes of a mesh-division model and that is composed of not only capacitance (C) elements but also other elements including resistance (R), inductance (L), and conductance (G). More specifically, in the present embodiment, an analytical circuit model is configured with a cell for each mesh and a branch between each pair of adjacent meshes. Then, according to the following setup conditions J, each aforementioned element is set for each cell, between each pair of adjacent cells, for each branch, and between each pair of adjacent branches.

Cell/Branch Setup Conditions J (1) Each branch has, as its own elements, a resistance (R) and a self-inductance (L) that are connected in series.

(2) Each pair of adjacent branches have, as their mutual element, a mutual inductance (L) therebetween.

(3) Each cell has, as its own elements, a capacitance (C) and a conductance (G) to the ground.

(4) Each pair of adjacent cells have, as their mutual elements, a capacitance (C) and a conductance (G) therebetween.

Since a cell corresponds to each of the divided meshes and since a branch corresponds to each pair of adjacent meshes, any data can be stored in correspondence with the mesh position information.

Figure 9A:
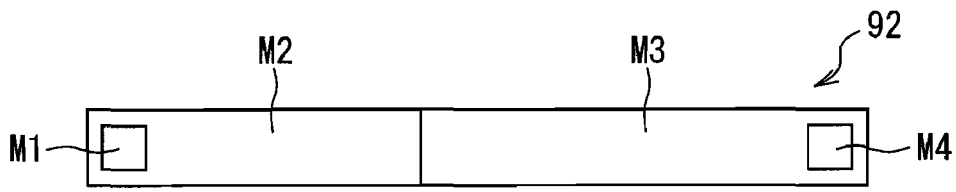
FIG. 9A is a plan view of a layout divided into meshes.

Referring next to FIGS. 9A to 9D, the case where an analytical circuit model is configured with inductance elements and the values of the inductance elements are extracted as circuit constants is described. Specifically, according to (1) and (2) of the above setup conditions J, the mesh-division model 92 in FIG. 9A is configured as an analytical circuit model in FIG. 9B.

Figure 9B:
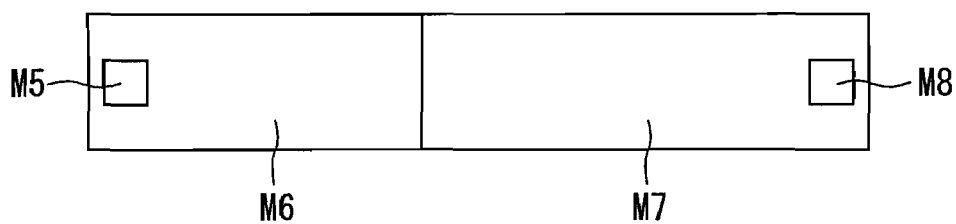
FIG. 9B illustrates an example of an analytical circuit model.

In FIG. 9B, an analytical circuit model 97 is configured with branches B1 to B6 between each pair of adjacent meshes. The configuration is also such that each of the branches B1 to B6 has a self-inductance element, and each pair of adjacent branches have mutual inductance elements therebetween. For example, the branch B1 has a self-inductance element L11, and the two branches B1 and B2 have mutual inductance elements L12 and L21 therebetween. To simplify the drawing, some of the mutual inductance elements are not shown.

Figures 9C, 9D:
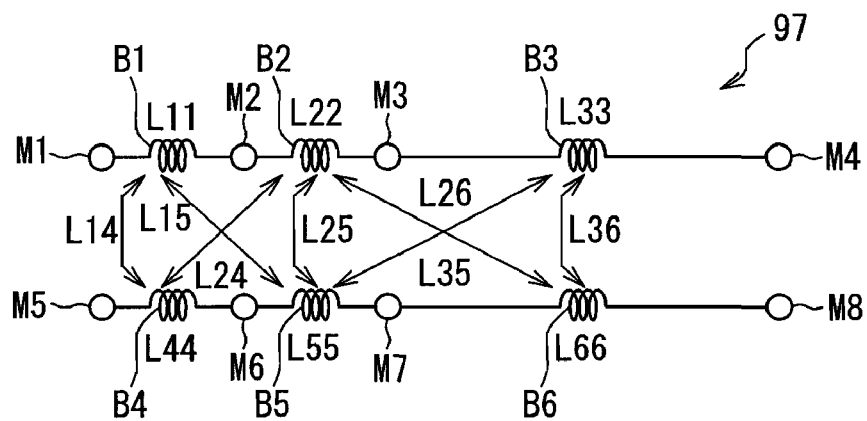
FIGS. 9C and 9D illustrate an example of an L-matrix.

Based on such a configured analytical circuit model 97, analytical processing is performed to extract a circuit constant associated with each of the branches B1 to B6. In the present embodiment, as illustrated in FIG. 9C, the analytical circuit model 97 is converted into an L-matrix 99, and then as illustrated in FIG. 9D, each element (the value of each inductance element) of the converted L-matrix 99 is derived from an analysis operation. Through such an analysis operation, for example, the value of the self-inductance element L11 is extracted as a circuit constant associated with the branch B1. Likewise, the values of the mutual inductance elements L12 and L21 are extracted as the circuit constants associated with the space between the two branches B1 and B2. Such extracted circuit constants then are stored in a history database to be reused in the next and subsequent analyses. At that time, in the history database, the extracted circuit constants are stored in relation to the mesh position information on the analyzed mesh-division model.

In the case of the inductance elements, for example, the value (or circuit constant) of the self-inductance element L11 associated with the branch B1 is stored in relation to the mesh position information on the two meshes M1 and M2 that bridge the branch B1. Similarly, the values (or circuit constants) of the mutual inductance elements L12 and L21 associated with the space between the two branches B1 and B2 are stored in relation to both the mesh position information on the two meshes M2 and M2 that bridge the branch B1 and the mesh position information on the two meshes M2 and M3 that bridge the branch B2.

In this way, the mesh position information on the analyzed mesh-division model and the extracted circuit constants (the values of the inductance elements) associated with the meshes are stored in relation to each other in the history database. The stored extracted circuit constants (the values of the inductance elements) thus can be reused in the next and subsequent analyses.

Due to the processing with use of the above-mentioned analytical circuit model 97, the mutual inductance as a parasitic element can be isolated to be calculated, stored and reused. In the analytical circuit model 97 as shown in FIG. 9B, resistance (R) can be provided in addition to or in place of the self-inductance of each branch. Thereby, the resistance (R) can be isolated as a circuit constant so as to be calculated, stored and reused.

By using the above-described analytical circuit models 14, 94 and 97, it is possible to divide the impedance Z of the meshes into components (RLGC), which are then calculated, stored and reused respectively.

For example, in the method of moment, a rooftop basis function is defined with respect to each pair of cells of meshes. By calculating a current I and a voltage V with respect to this rooftop basis function from the electromagnetic field, an impedance matrix equation Z ($[Z]\cdot[I]=[V]$) is obtained. The impedance matrix equation Z can be divided into the component of the self-elements (R, L, C, G) and the component of the mutual elements (L, C, G) in the present embodiment. Therefore, each component of the impedance matrix equation can be solved by using the matrix of the self-elements (R, L, C, G) and the matrix of the mutual elements (L, C, G), respectively. Thus, the impedance matrix equation Z can be solved by using the matrix of the self-elements (R, L, C, G) and the matrix of the mutual elements (L, C, G).

For example, a matrix obtained from the above-described analytic circuit model 94 (FIG. 7A) can be used for isolating and calculating the parasitic component C of such an impedance matrix equation. Similarly, a matrix obtained from the above-described analytic circuit model 97 (FIG. 9C) can be used for isolating and calculating the component L of an impedance matrix equation.

More specifically, a self-element can be divided by using the equation $[Rs+j\omega Ls+1/(j\omega Cs)+Gs]\cdot[I]=[V]$, and a mutual element can be divided by using the equation $[j\omega Lm+1/(j\omega Cm)+Gm]\cdot[I]=[V]$.

In this manner, the impedance Z on the meshes can be divided into respective components by configuring an equivalent circuit model including components (RLGC) based on the divided meshes. The divided components are calculated, stored and reused respectively. It should be noted that the method of deriving the respective components (RLGC) divided from the impedance Z is not limited to the above example.

Figure 10:
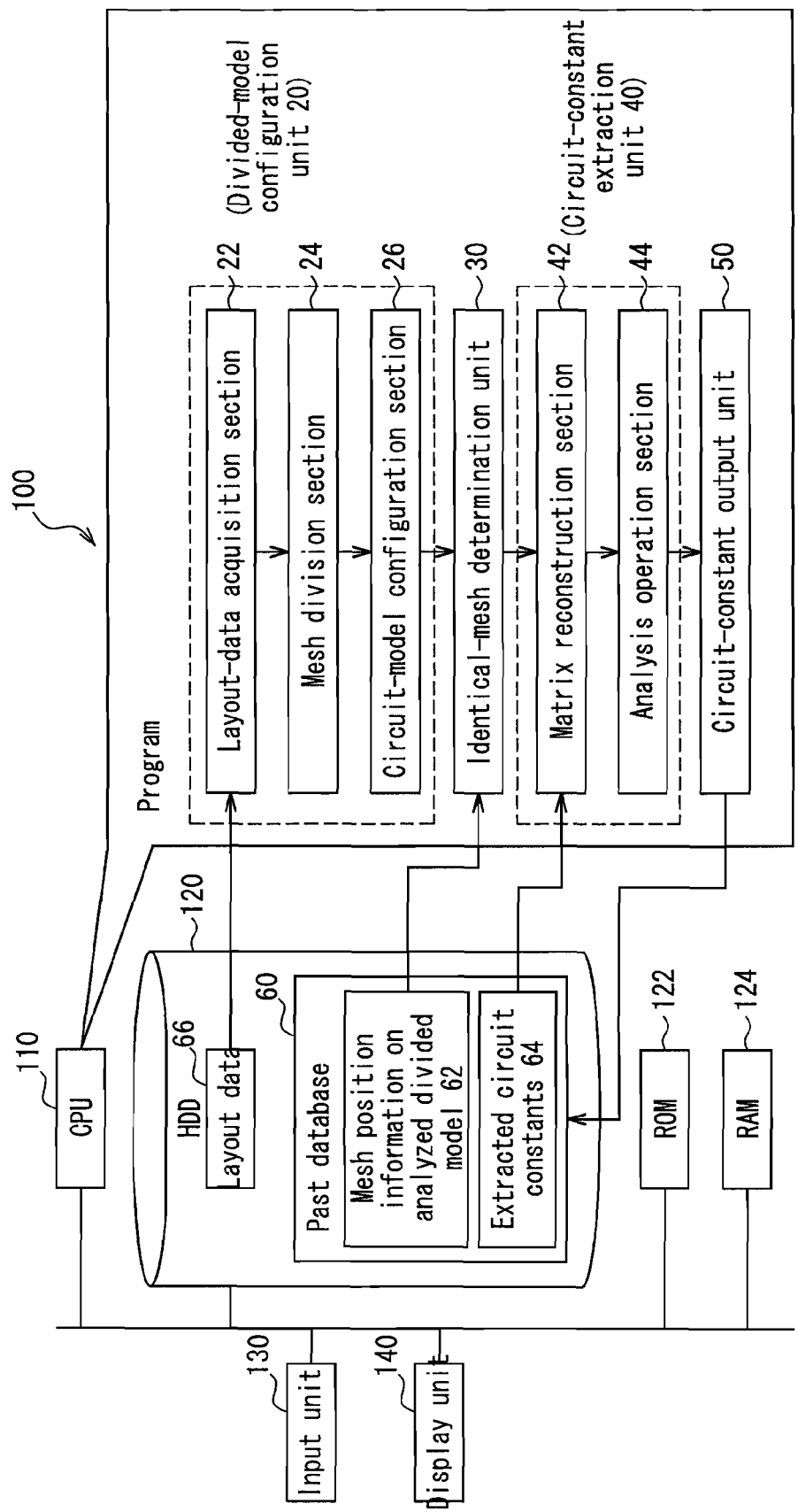
FIG. 10 illustrates a configuration of a circuit board analyzer according to one embodiment of the present invention.

The analysis method according to the present embodiment can be implemented by, for example, an analyzer 100 illustrated in FIG. 10. FIG. 10 is a block diagram illustrating a general configuration of the analyzer of the present embodiment implemented by a computer.

As illustrated in FIG. 10, the computer includes a CPU (or arithmetic part) 110, a ROM 122, a RAM 124, and a HDD (or storage unit) 120. The computer is connected to a display unit (in the present example, a display) 140 and an input unit (e.g., a keyboard or a mouse, etc.) 130 through an interface not shown. The CPU 110 outputs to the display 140 data that indicates through the interface to the display 14 the various kinds of displays to provide. The display 140 provides various kinds of displays upon acquisition of such data. The CPU 110 receives a signal from a keyboard or a mouse (the input unit 130) through the interface and performs processing according to instructions input from the input unit 130.

The storage unit 120 is, for example, a HDD for storing various kinds of setting data. In the present embodiment, the HDD 120 stores a history database 60. The history database 60 stores mesh position information 62 on an analyzed mesh-division model that has gone through analytical processing and extracted circuit constants 64 extracted through the analytical processing in relation to each other. The format for storing data in the history database 60 (e.g., in table form or in list form, etc.) is not limited in particular.

The history database 60 may be stored in the RAM 124, instead of the above HDD 120. Alternatively, if necessary, it may be recorded on a computer-readable recording medium (e.g., an optical recording medium, a magnetic recording medium, a magneto-optic recording medium, a flash memory, etc.)

The HDD 120 also stores layout data 66 on a new circuit board to be analyzed. In the present embodiment, the layout data 66 includes substrate data, wiring data, and parts data. The substrate data is data that represents the size, structure, and material of a circuit board. When a circuit board to be designed is a multilayer substrate, the substrate data also includes data that represents the structure for and the material constant of each layer. The wiring data is data that represents the layout of wiring to be installed on a substrate and includes, for example, data that represents the shape of a wiring pattern (e.g., origin coordinates, pattern length, pattern width, etc.) When a circuit board to be analyzed is a multilayer substrate, the wiring data includes data that represents the shape of the wiring pattern for each layer. The parts data is data that represents the characteristics of various parts of the circuit on the circuit board.

Such layout data 66 is generated, for example, upon receipt of an input from the input unit 130 such as a keyboard or a mouse, etc. The generated layout data 66 is stored in the HDD 120 and, if necessary, output to the display unit (in the present example, the display, etc.) 140. Alternatively, the layout data 66 to be analyzed may be loaded through any other medium (e.g., a recording medium such as a CD-ROM, or a communication circuit, etc.).

Such generated layout data 66 is analyzed according to a program stored in the ROM 122. Specifically, the CPU 110 is capable of executing a program recorded on the ROM 122, using the RAM 124 as a work area. In the present embodiment, the program has the ability to analyze circuit boards that are used to build various kinds of electronic equipment and, through the use of the layout data 66 recorded on the HDD 120, supports the process of determining the layout of a wiring pattern formed on a circuit board or the layout of various kinds of parts mounted on a substrate, etc.

This program performs interference analysis on any desired circuit board, based on such previously generated data or such data generated in the process of circuit design. Thus, the program provides a division-model configuration unit 20, an identical-mesh determination unit 30, a circuit-constant extraction unit 40, and a circuit-constant output unit 50. Namely, the CPU 110 implements the program so as to provide these function units. Therefore, embodiments of the present invention include also such a program and a storage medium that stores the program.

The division-model configuration unit 20 divides the layout of a new to-be-analyzed circuit board into meshes to configure a new mesh-division model. In the present embodiment, the division-model configuration unit 20 includes a layout-data acquisition section 22 for acquiring the layout data 66 stored in the HDD 120; a mesh division section 24 for dividing the acquired layout (e.g., wiring layout) into meshes; and a circuit-model setting section 26 for configuring an analytical circuit model (e.g., an analytical circuit model consisting of R, L, G, and C elements) based on the relative positions of the meshes obtained by the division.

The identical-mesh determination unit 30 gains access to the history database 60 stored in the HDD 120 to acquire mesh position information 62 on an analyzed mesh-division model. Then, a comparison is made between the acquired mesh position information 62 on the analyzed mesh-division model and the mesh position information on the new mesh-division model configured by the division-model configuration unit 20 to determine identical meshes that have identical mesh position information.

The circuit-constant extraction unit 40 performs analytical processing based on the new mesh-division model to extract a new circuit constant associated with each mesh of the new mesh-division model. In other words, the circuit-constant extraction unit 40 performs an analysis operation based on the analytical circuit model configured by the circuit-model setting section 26 to extract a circuit constant associated with each mesh (or the value of each element of an analytical circuit model). At that time, the circuit-constant extraction unit 40 uses, as the new circuit constant associated with the identical meshes determined by the identical-mesh determination unit 30, an extracted circuit constant 64 that is linked to the position information on the identical meshes.

In the present embodiment, the circuit-constant extraction unit 40 includes a matrix reconstruction section 42 and an analysis operation section 44. The matrix reconstruction section 42 converts an analytical circuit model into a matrix of elements (cf., FIG. 7A) and gains access to the history database 60 stored in the HDD 120 to acquire the extracted circuit constant 64 that is linked to the position information on the identical meshes. Then, a reuse setting is constructed by substituting the acquired extracted circuit constants 64 for some of the matrix elements (cf., FIG. 7B). The analysis operation section 44 derives each element (the value of each element) of the matrix, for which the reuse setting has been constructed, from an analysis operation. At that time, the analysis operation section 44 derives only those matrix elements (the values of elements) that were not substituted by the extracted circuit constants 64 (cf., FIG. 7C).

Alternatively, the matrix reconstruction section 42 may generate a matrix from the analyzed mesh-division model. More specifically, the matrix reconstruction section 42 may gain access to the history database 60 stored in the HDD 120 and generate a circuit constant matrix consisting of the extracted circuit constants 64 (cf., FIG. 8A). Then, a reuse setting is constructed by deleting some of the matrix elements (cf., FIG. 8B) and adding new elements (cf., FIG. 8C). The analysis operation section 44 then derives each element (the value of each element) of the matrix, for which the reuse setting has been constructed, from an analysis operation. At that time, the analysis operation section 44 derives only newly added matrix elements (the values of elements) (cf., FIG. 8D).

Figure 11:
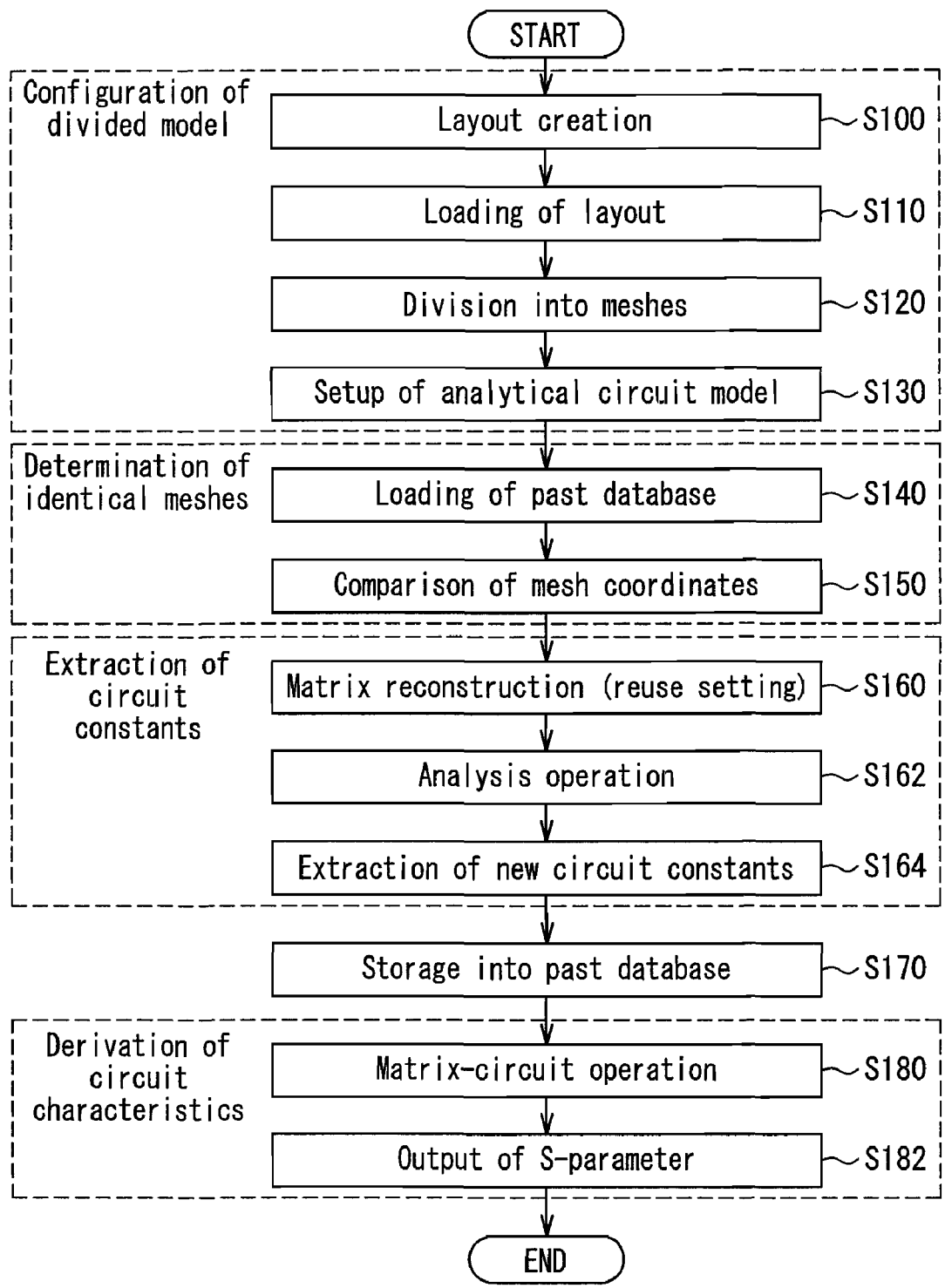
FIG. 11 is a flow chart illustrating an example of a circuit board analysis method according to one embodiment of the present invention.

Next, referring additionally to FIG. 11, the circuit board analysis method according to the present embodiment is described in more detail. FIG. 11 is a flow chart illustrating an example of the analysis method according to the present embodiment. This circuit board analysis method is also adaptable for use as a wiring board design method that includes circuit board analytical processing.

First, the layout of wiring to be installed on a circuit board is created (in step S100) and loaded (in step S110). These steps are implemented by the layout-data acquisition section 22. More specifically, the layout-data acquisition section 22 generates the layout data 66 (substrate data, wiring data, and parts data) under instructions to create the layout of a substrate. More specifically, upon receipt of an input from the input unit 30 such as a keyboard, or a mouse, etc., image data that represents a circuit board layout is generated according to the input. The results then are displayed on the display (display unit) 140 and at the same time, data that represents the circuit board layout is stored in the HDD 120 as layout data.

Alternatively, the layout-data acquisition section 22 may acquire layout data 66 (substrate data, wiring data, and parts data) that previously was generated and recorded on the HDD 120 and may display the same as an image that represents the circuit board layout. Specifically, the layout data 66 (substrate data, wiring data, and parts data) is acquired to create the layout and is output to the display 140. As a result, the substrate layout is displayed on the display 140.

Then, the wiring layout acquired in step S110 is divided into meshes to configure a new mesh-division model (in step S120). The division into meshes is made according to mesh conditions. The mesh conditions as used herein include, for example, analytical frequency (or frequency point) and mesh density (or the number of meshes), etc. An acceptable mesh density may, for example, be about ⅓₀ of the wavelength λ of the analytical frequency. The mesh conditions can be set as appropriate depending on the shape and type of the circuit board to be analyzed, etc. This step is implemented by the mesh division section 24. More specifically, upon receipt of an input of the mesh conditions from the input unit 130, the mesh division section 24 divides the wiring layout of a circuit board into meshes to configure a new mesh-division model and displays the results on the display 140. The mesh division section 24 can implement the mesh division by using a mesh condition previously stored in the HDD 120 in place of the mesh condition inputted at the input unit 130.

Then, an analytical circuit model is configured (in step S130). This step is implemented by the circuit-model setting section 26. More specifically, the circuit-model setting section 26 configures an analytical circuit model (which consists of R, L, G, and C elements) based on the new mesh-division model configured in step S120 and under the setup conditions J.

Then, the history database 60 is loaded (in step S140). Here, the circuit board designer arbitrarily can select a history database 60 to be loaded. For instance, the circuit board designer arbitrarily can select a history database 60 that includes an analyzed mesh-division model configured based on a past layout that is the closest to the one presently been analyzed from all the past layouts that were analyzed in the past. The loading of the history database is implemented by the identical-mesh determination unit 30 upon receipt of an input from the input unit 130 such as a keyboard or a mouse, etc. More specifically, the identical-mesh determination unit 30 gains access to a history database under instructions to load a history database and acquires the mesh position information 62 on an analyzed mesh-division model stored in the history database.

Then, a comparison is made between the mesh position information on the acquired analyzed mesh-division model and that on the new mesh-division model to determine identical meshes that have identical mesh position information (in step S150). This step is implemented by the identical-mesh determination unit 30. To be more specific, the identical-mesh determination unit 30 loads the mesh position information on an analyzed mesh-division model and makes a comparison between the mesh position information on the analyzed mesh-division model and that on the new mesh-division model configured in step S120 to determine whether any pair of meshes have identical mesh position information. Then, those meshes determined as having identical mesh position information are determined as identical meshes.

Then, the analytical circuit model configured in step S130 is converted into a matrix and a reuse setting is constructed (in step S160). This step is implemented by the matrix reconstruction section 42. In the present embodiment, a reuse setting is constructed based on the matrix generated from the new mesh-division model, i.e., by substituting the extracted circuit constants for the matrix. Specifically, the matrix reconstruction section 42 converts the analytical circuit model configured in step S130 into a matrix of elements and simultaneously gains access to a history database 60 stored in the HDD 120 to load the extracted circuit constant 64 that is related to the mesh position information on the identical meshes determined in step S150. Then, a reuse setting is constructed by substituting a loaded extracted circuit constant 64 for a corresponding matrix element.

Alternatively, a reuse setting may be constructed based on a matrix (or circuit constant matrix) generated from the analyzed mesh-division model, i.e., by adding new elements to the circuit constant matrix. More specifically, the matrix reconstruction section 42, as illustrated in FIGS. 9A to 9D, may construct a reuse setting first by loading the extracted circuit constants 64 stored in the history database 60 to generate a circuit constant matrix of those extracted circuit constants 64 and then by deleting some of the matrix elements and adding new elements.

Then, an analysis operation is performed based on the elements of the matrix (in step S162) to derive the values (or circuit constants) of the elements (R, L, G, and C), using the analytical circuit model (in step S164). The technique of such analytical processing is not particularly limited, and various techniques, such as the method of moments, the PEEC (partial element equivalent circuit) method, etc., can be adopted. Or, a quasi-static approximation of Green's function may be used. Through this analysis operation, the concrete value of each element (R, L, G, and C) can be derived. This step is implemented by the analysis operation section 44.

Then, the derived values (or circuit constants) of the elements are stored in a history database in the HDD 120. Specifically, in step S170, the circuit constants (or the values of the elements) obtained through analytical processing are stored as extracted circuit constants in a new history database. At the same time, mesh position information on the new mesh-division model that has gone through analytical processing is stored as mesh position information on an analyzed mesh-division model in the new history database. At that time, in the history database, the mesh position information on the analyzed mesh-division model and the extracted circuit constants are stored in relation to each other. This step is implemented by the circuit-constant output unit 50. Such circuit constants stored in the history database can be reused in the next and subsequent analytical processing of circuit boards.

The circuit-constant output unit 50 is also capable of displaying circuit constants on the display (display unit) 140 based on the derived values (or circuit constants) of elements. More specifically, after the circuit-constant extraction step in step S164, the step of outputting the circuit constants additionally may be implemented. The display (display unit) 140 can provide displays in any previously defined, desired output format. For instance, when the circuit board designer designates a netlist format for the output, the circuit-constant output unit 50 creates a netlist from the derived values of elements and displays the same on the display 140. When an S-parameter format is designated for the output, the circuit-constant output unit 50 can display data on the display 140 in S-parameter format. In this case, the circuit-constant output unit 50 further performs the step of operating a circuit matrix (e.g., an S-matrix). For example, the circuit-constant output unit 50 operates an S-matrix, using the derived value of each element (in step S180) and displays (outputs) the obtained S parameter on the display 140 (in step S182).

As one example of the S parameter to be displayed, for example, when analysis is performed on a circuit board provided with filter circuit elements, a parameter S21 can be displayed as an index to the evaluation of filter characteristics. Alternatively, an equivalent circuit may be created using the derived values of elements and may be displayed on the display 140. As a matter of course, any other value, such as the value obtained through the analysis process, or the value calculated from the value obtained through the analysis process may be displayed. The display 140 is capable of providing any suitable display on its screen according to the characteristics and the like of a circuit board to be analyzed. As another alternative, it is also possible to display a current distribution and the like on a layout based on the derived S parameter.

As described so far, according to the present embodiment, the extracted circuit constants obtained through analytical processing and mesh position information on an analyzed mesh-division model are stored in the storage unit in relation to each other, and those stored extracted circuit constants are used in the next and subsequent analyses. Thus, part of the analytical processing can be omitted, which simplifies the processing. This considerably shortens the analytical processing time without sacrificing the accuracy of the analysis and consequently allows analysis of complicated wiring patterns that cannot be handled in conventional electromagnetic field analysis and also allows large-scale analysis. Such a considerable reduction in processing time also facilitates the provision of feedback on circuit board design, thus allowing the optimization of circuit board layouts.

Figure 12A:
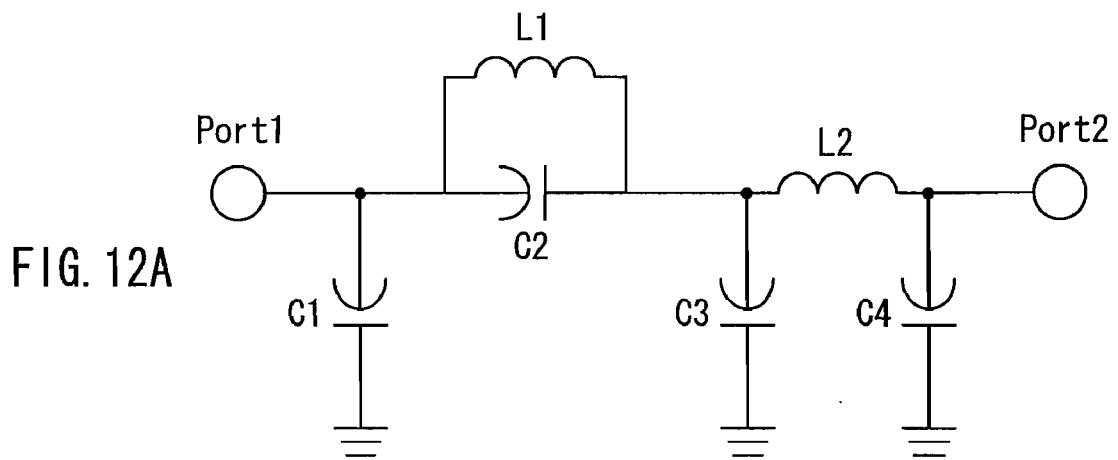
FIG. 12A is a circuit diagram illustrating some ideal circuit elements of a low-pass filter.
Figure 12B:
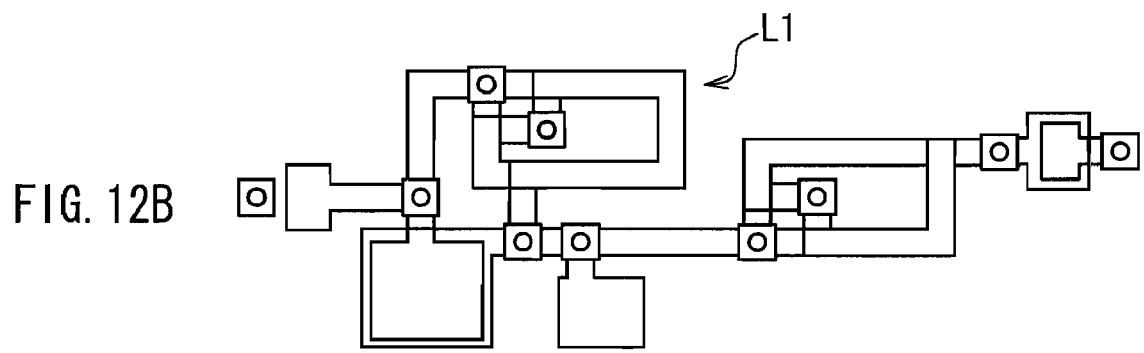
FIGS. 12B and 12C illustrate an example of a wiring layout created based on the circuit diagram.
Figure 12C:
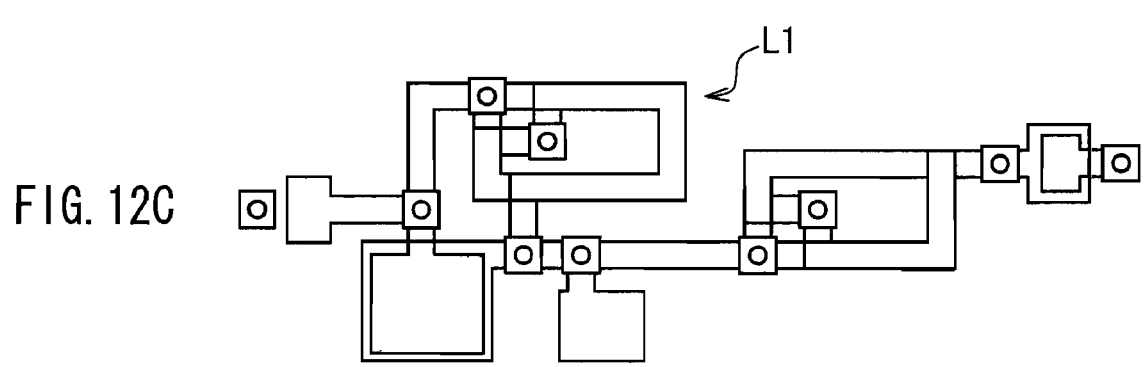

In order to verify the effect of the circuit board analysis method (e.g., the analysis method illustrated in the flow chart of FIG. 11) according to the present embodiment, the inventors of the present invention created a wiring layout (wiring dimensions: 1.6 mm×5.6 mm) illustrated in FIG. 12B, using ideal circuit elements for the low-pass filter in FIG. 12A, and measured the analysis time required for typical electromagnetic field analysis (in which a reuse setting is not constructed). The inventors also created a wiring layout in such a manner that the right side of an inductance pattern L1 within the wiring layout in FIG. 12B was made smaller on the left side as illustrated in FIG. 12C, and then measured the analysis time required for analytical processing in which the analytical results obtained in FIG. 12B were reused.

The results showed that while the analysis time required for a typical electromagnetic field analysis was about 2.5 minutes, the analysis time required for the analytical processing according to the present embodiment was about 30 seconds. This confirmed that the analysis method according to the present embodiment allows a considerable reduction in analytical processing time. This is due to the fact that the reuse setting allows the analysis operations of as much as 87% of all 1.1 million elements of the C-matrix to be omitted and also allows the analysis operations of as much as 80% of all 4.2 million elements of the L-matrix to be omitted. In the above example, the analysis conditions were set such that the upper limit of the analytical frequency was 6 GHz and the mesh size was $\lambda/30$.

Figure 13:
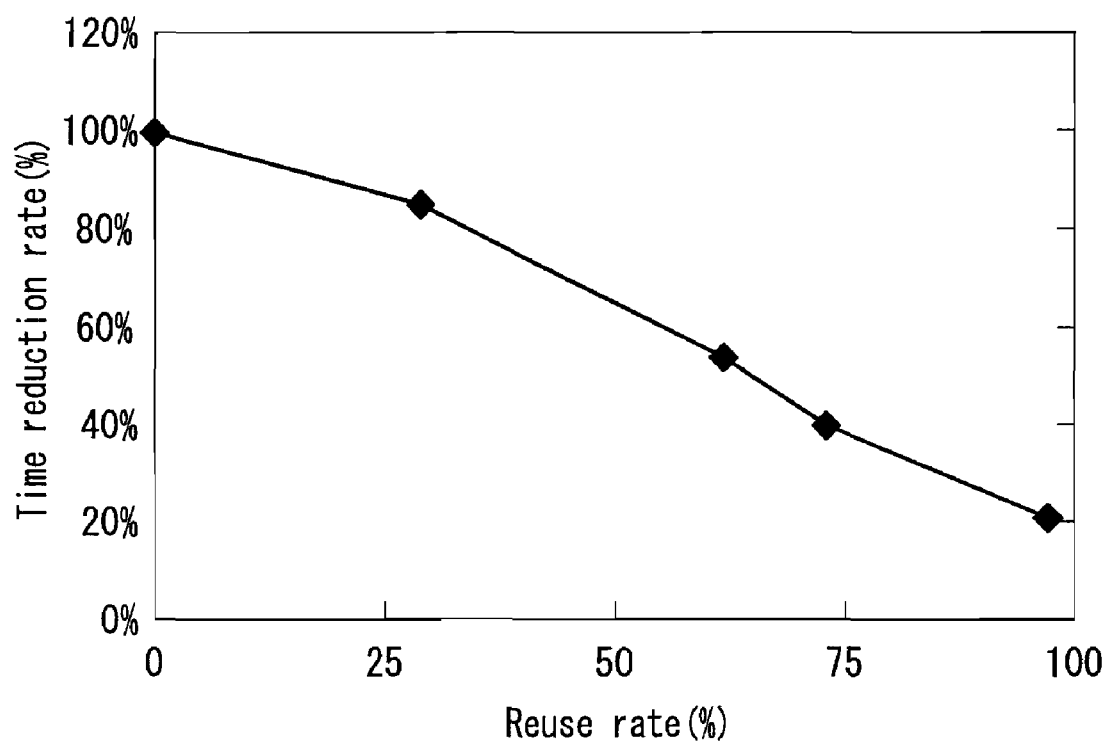
FIG. 13 illustrates the relationship between the reuse rate and the time reduction rate.

FIG. 13 is a graph illustrating the relationship between the reuse rate and the time reduction rate. In the drawing, the horizontal axis indicates the reuse rate (%), and the vertical axis indicates the time reduction rate (%). The "time reduction rate" as used herein refers to a percentage that indicates how much the analysis time can be shortened as compared with the case where no reuse setting is constructed. As is evident from FIG. 13, the time reduction rate drops with increasing reuse rate, which confirmed that the analysis time can be shortened considerably as the reuse rate rises. It is also confirmed that a reuse rate of more than 90% can allow analysis to be completed in a period of time as short as one-fifth the time required in the case where no reuse setting is constructed.

Figure 14:
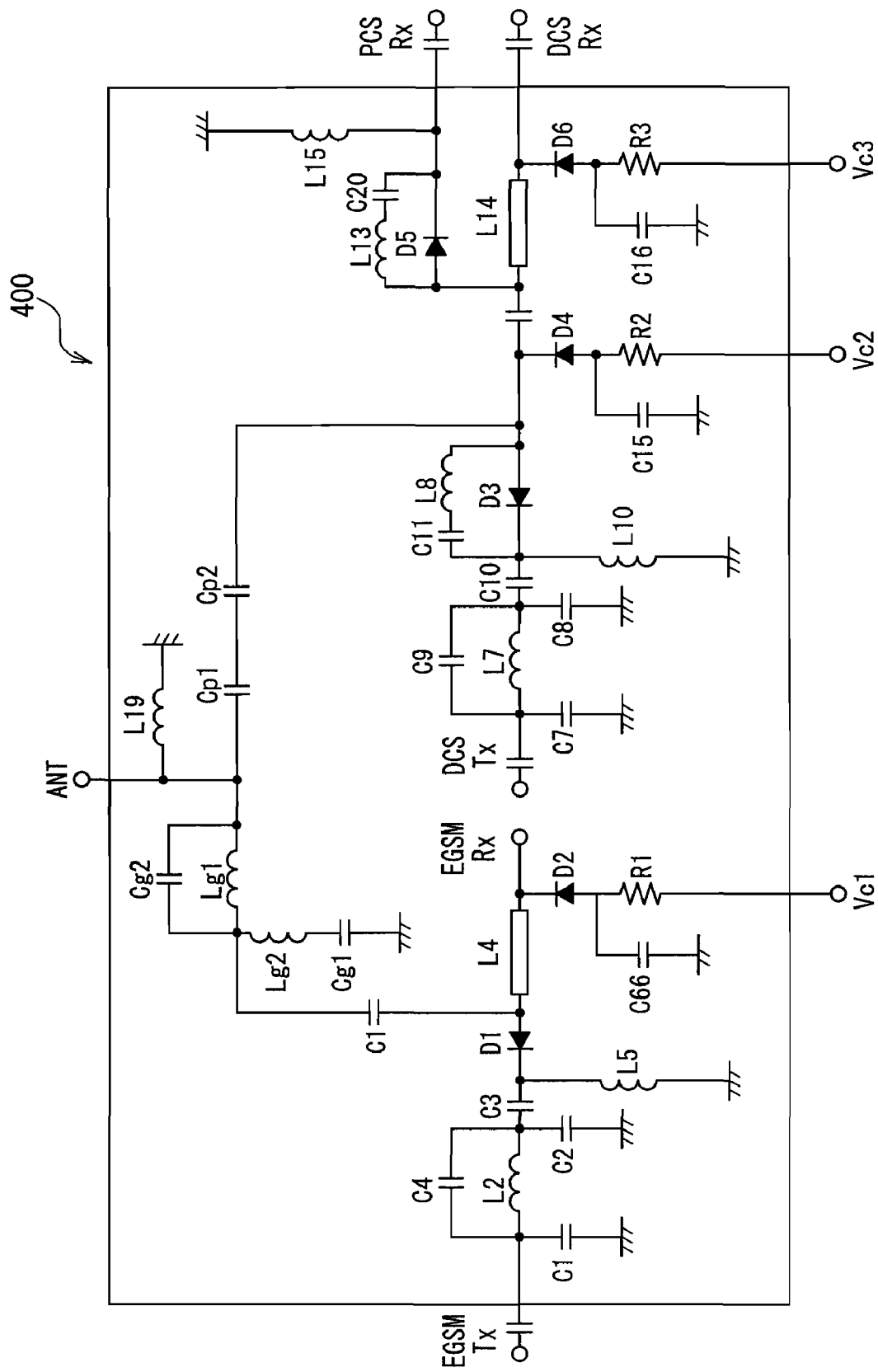
FIG. 14 illustrates an ideal equivalent circuit of an antenna switch module.
Figure 15:
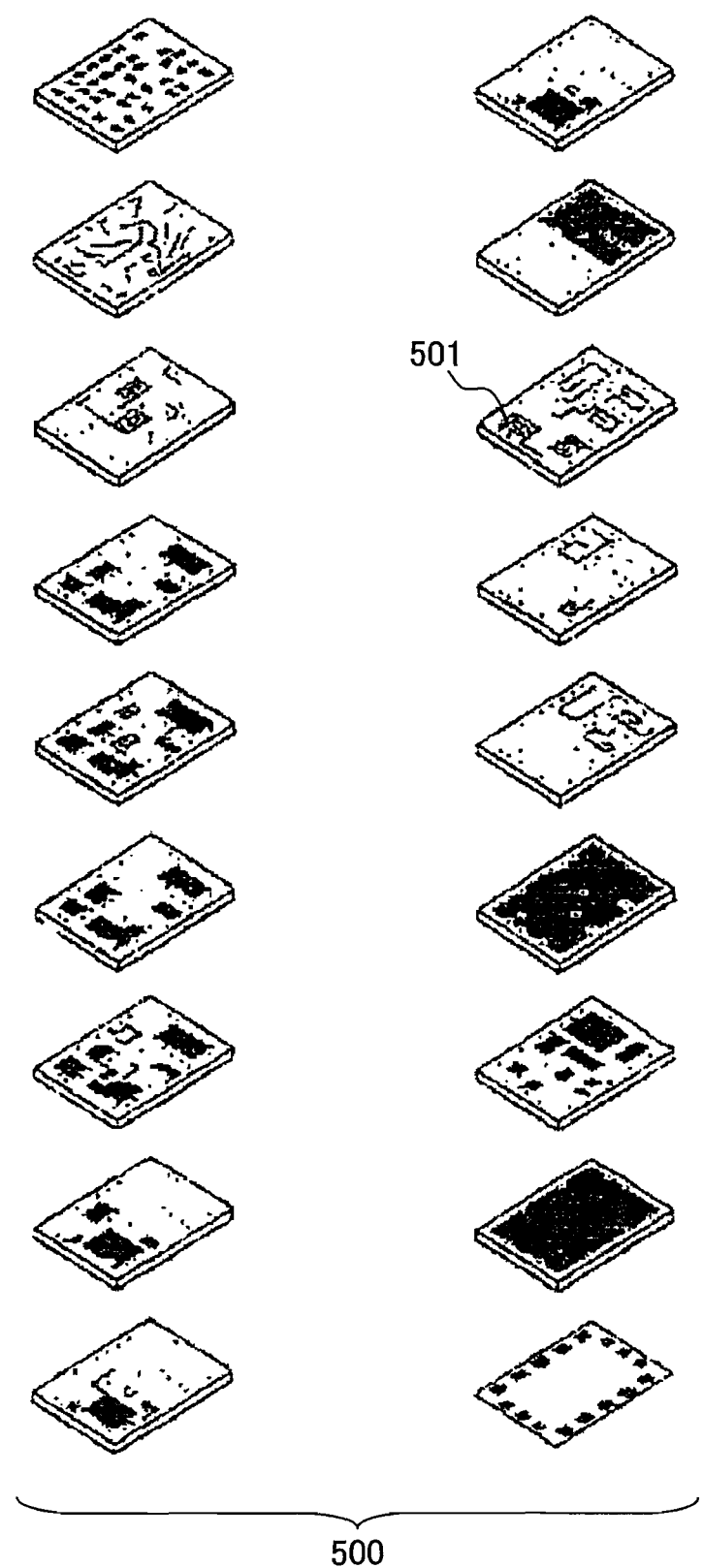
FIG. 15 illustrates the layers constituting a multilayer substrate 500.

The analysis method according to the present embodiment will have a more considerable effect when used in the analysis of circuit boards with a more complicated configuration than used in the circuit boards as illustrated in FIGS. 12A and 12B with a simple configuration. For example, when the layout of an ideal equivalent circuit 400 of an antenna switch module as illustrated in FIG. 14 is designed with the help of CAD, the result is a multilayer substrate 500 as illustrated in FIG. 15. When analysis is performed on such a complicated multilayer substrate 500, which consists of 18 layers, the analysis time required for typical electromagnetic field analysis (in which no reuse setting is constructed) is enormous because the wiring pattern is too complicated. However, through the use of the analyzer according to the present embodiment, high-speed analysis is possible in the second and subsequent rounds of analyses. In the analysis method according to the present embodiment, even a semiconductor package (e.g., BGA package) and the like can be analyzed in a short time in the second and subsequent rounds of analyses. According to the inventors of the present invention, the analysis method according to the present embodiment is also adaptable for use in the analysis of the ground plane of a BGA package.

It is also possible, after the completion of the circuit board analysis method according to the present embodiment, to proceed further with the circuit board design method and then to manufacture the designed circuit board. Alternatively, the analysis method according to the present embodiment may be implemented independently instead of as one step in a circuit board design method. In a typical circuit board design method, the basic specifications of the electronic equipment (e.g., function and performance) are first determined; then a circuit (or a logical circuit diagram) that can achieve those basis specifications is created; then simulations are repeatedly performed on the created logical circuit diagram and, if there is no problem in operation, the design of a layout that includes actual elements and a wiring pattern is created with the help of CAD; and then a mask is created. The analysis method according to the present embodiment can be implemented as one step in the above layout design process. Alternatively, the designed circuit boards further may be manufactured using the mask generated by the design method including the analysis method according to the present embodiment.

Despite the fact that the present invention is explained by referring to the above embodiments, such descriptions are not limiting, and various modifications of the invention are, of course, also possible. For instance, in the aforementioned embodiment an analytical circuit model is configured under the cell/branch setup conditions J to determine elements; however, if elements that may have influence on wiring interference can be extracted as circuit constants, any circuit model other than the analytical circuit model configured under the setup conditions J may be configured under any other setup conditions given to each cell and each branch.

In the aforementioned circuit board analysis procedure, any other arbitrary step may be added. For instance, for module analysis and the like, after the S-parameter output in FIG. 11, another S parameter or any arbitrary circuit may be connected in order to display characteristics.

Moreover, although in the aforementioned embodiment the circuit board to be analyzed is a printed circuit board, the analysis method according to the present invention is applicable not only to printed circuit boards but also to, for example, various kinds of circuit boards such as substrates with built-in parts or semiconductor integrated circuit substrates, etc.

Still more, although the aforementioned embodiment adopted a configuration in which the layout data 66 is generated by a computer, any other configuration may be adopted, for example, in which part or all of the layout data 66 is generated by any other computer and used for circuit board analysis. In such a configuration, for example, parts databases produced by a parts maker can be used; or, for a design change in part of a circuit board, it is possible to use already generated data for circuit board analysis. This reduces manpower in substrate design.

Furthermore, although the above computer is configured to analyze a circuit board through the execution of a program in a computer used by the substrate designer, the present invention may be implemented in concert with different computers. For instance, the layout data 66 and the like may be transmitted from a first computer through a network to a second computer, and then the data (e.g., a netlist consisting of extracted values of elements) obtained through the analysis of a circuit board may be transmitted from the second computer to the first computer. With such a configuration, the present invention can be adopted by only equipping the first computer with part of a program, i.e., a module for displaying input data or analytical results.

The circuit board analyzer and analysis method according to the present invention are, in particular, adaptable for use in the electromagnetic field analysis of circuit boards, which are used in various kinds of electronic equipment, and they are effective for applications such as implementing electromagnetic field analysis with efficiency, etc.

The invention may be embodied in other forms without departing from the spirit or the essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board analyzer for dividing a layout of a circuit board into meshes and performing analytical processing based on a mesh-division model obtained by such division to extract a circuit constant associated with each mesh of the mesh-division model, the analyzer comprising:
   a storage unit for storing mesh position information that represents the position of each mesh of an analyzed mesh-division model that has gone through the analytical processing and extracted circuit constants obtained through the analytical processing in relation to each other;
   a division-model configuration unit for dividing the layout of a new to-be-analyzed circuit board into meshes to configure a new mesh-division model;
   an identical-mesh determination unit for making a comparison between mesh position information that represents the position of each mesh of the configured new mesh-division model and the mesh position information on the analyzed mesh-division model to determine identical meshes that have identical mesh position information; and
   a circuit-constant extraction unit for performing analytical processing based on the new mesh-division model to extract a new circuit constant associated with each mesh of the new mesh-division model and reusing, as a new circuit constant associated with the determined identical meshes, an extracted circuit constant that is related to the mesh position information on the identical meshes.

2. The analyzer according to claim 1, wherein the mesh position information includes vertex coordinates for each mesh.

3. The analyzer according to claim 1, wherein the division-model configuration unit configures an analytical circuit model based on the relative positions of the meshes obtained by the division.

4. The analyzer according to claim 3, wherein the division-model configuration unit configures the analytical circuit model with a cell for each mesh and a branch between each pair of adjacent meshes.

5. The analyzer according to claim 1, wherein the circuit-constant extraction unit constructs a reuse setting by substituting the extracted circuit constants for some matrix elements.

6. The analyzer according to claim 1, wherein the circuit-constant extraction unit constructs a reuse setting by deleting the extracted circuit constants from some matrix elements and adding new elements.

7. The analyzer according to claim 1, wherein the division-model configuration unit generates data of an equivalent circuit representing the impedance on the new mesh with a component comprising at least one element selected from the group consisting of resistance (R), inductance (L), conductance (G) and capacitance (C); and
   the circuit-constant extraction unit calculates at least one value of the resistance (R), the inductance (L), the conductance (G) and the capacitance (C) as the circuit constant.

8. The analyzer according to claim 1, wherein the division-model configuration unit divides the layout of the circuit board into new meshes and sets cells each corresponding to each of the new meshes; and
   generates data of an equivalent circuit comprising capacitance (C) between each of the cells and the ground, and capacitance (C) between each pair of cells.

9. The analyzer according to claim 1, wherein the division-model configuration unit divides the layout of the circuit board into new meshes and sets a branch between each pair of new meshes, and generates data of an equivalent circuit comprising self-inductance (L) at each of the branches and mutual inductance (L) between each pair of branches.

10. The analyzer according to claim 1, wherein the division-model configuration unit divides the layout of the circuit board into new meshes and sets cells each corresponding to each of the new meshes and branches connecting the cells, and generates data of an equivalent circuit comprising:
resistance (R) and inductance (L) corresponding to each of the branches,
mutual inductance (L) between each pair of branches,
capacitance (C) and conductance (G) between each of the cells and the ground, and
capacitance (C) and conductance (G) between each pair of cells.

11. A circuit board analyzer, comprising:
a division-model configuration unit for dividing a layout of a to-be-analyzed circuit board into new meshes, configuring position information of each of the new meshes, and generating data showing an equivalent circuit corresponding to the new meshes; and
a circuit-constant extraction unit for gaining access to a storage unit that stores analyzed mesh position information, the analyzed mesh portion information representing the position of each mesh of an analyzed mesh-division model that has gone through analytical processing, and a circuit constant of an equivalent circuit corresponding to the analyzed meshes, and calculating circuit constants of the new meshes and storing the circuit constants in the storage unit by use of any circuit constants of analyzed meshes having position information identical to the position information of the new meshes that represents the position of each mesh of the new mesh-division model.

12. The analyzer according to claim 11, wherein the division-model configuration unit generates data of an equivalent circuit representing the impedance on the new mesh with a component comprising at least one element selected from the group consisting of resistance (R), inductance (L), conductance (G) and capacitance (C); and
the circuit-constant extraction unit calculates at least one value of the resistance (R), the inductance (L), the conductance (G) and the capacitance (C) as the circuit constant.

13. The analyzer according to claim 11, wherein the division-model configuration unit divides the layout of the circuit board into new meshes and sets cells each corresponding to each of the new meshes; and
generates data of an equivalent circuit comprising capacitance (C) between each of the cells and the ground, and capacitance (C) between each pair of cells.

14. The analyzer according to claim 11, wherein the division-model configuration unit divides the layout of the circuit board into new meshes and sets a branch between each pair of new meshes, and
generates data of an equivalent circuit comprising self-inductance (L) at each of the branches and mutual inductance (L) between each pair of branches.

15. The analyzer according to claim 11, wherein the division-model configuration unit divides the layout of the circuit board into new meshes and sets cells each corresponding to each of the new meshes and branches connecting the cells, and generates data of an equivalent circuit comprising:
resistance (R) and inductance (L) corresponding to each of the branches,
mutual inductance (L) between each pair of branches,
capacitance (C) and conductance (G) between each of the cells and the ground, and
capacitance (C) and conductance (G) between each pair of cells.

16. A circuit board analysis method in which a layout of a circuit board is divided into meshes and analytical processing is performed based on a mesh-division model obtained by such division to extract a circuit constant associated with each mesh of the mesh-division model, the method comprising:
a storage step of storing mesh position information that represents the position of each mesh of an analyzed mesh-division model that has gone through the analytical processing and extracted circuit constants obtained through the analytical processing in relation to each other;
a division-model configuration step of dividing the layout of a new to-be-analyzed circuit board into meshes to configure a new mesh-division model;
an identical-mesh determination step of making a comparison between mesh position information that represents the position of each mesh of the new mesh-division model and the mesh position information on the analyzed mesh-division model to determine identical meshes that have identical mesh position information; and
a circuit-constant extraction step of performing analytical processing based on the new mesh-division model to extract a new circuit constant associated with each mesh of the new mesh-division model and reusing, as a new circuit constant associated with the identical meshes, an extracted circuit constant that is related to the mesh position information on the identical meshes.

* * * * *